US009338869B2

(12) United States Patent
Ishihara et al.

(10) Patent No.: US 9,338,869 B2
(45) Date of Patent: May 10, 2016

(54) EUV LIGHT SOURCE APPARATUS

(71) Applicants: Gigaphoton, Inc., Tochigi (JP); CKD Corporation, Aichi (JP)

(72) Inventors: Takanobu Ishihara, Kanagawa (JP); Hiroshi Itafuji, Aichi (JP)

(73) Assignees: GIGAPHOTON INC., Tochigi (JP); CKD CORPORATION, Aichi (JP)

( * ) Notice: Subject to any disclaimer, the term of this patent is extended or adjusted under 35 U.S.C. 154(b) by 0 days.

(21) Appl. No.: 14/875,166

(22) Filed: Oct. 5, 2015

(65) Prior Publication Data

US 2016/0029470 A1    Jan. 28, 2016

Related U.S. Application Data

(60) Continuation of application No. 14/047,895, filed on Oct. 7, 2013, now Pat. No. 9,192,038, which is a division of application No. 12/646,025, filed on Dec. 23, 2009, now Pat. No. 8,581,220.

(30) Foreign Application Priority Data

Dec. 24, 2008  (JP) .................................. 2008-328274
Dec. 21, 2009  (JP) .................................. 2009-288898

(51) Int. Cl.
*H05G 2/00* (2006.01)
*H01L 27/00* (2006.01)
(Continued)

(52) U.S. Cl.
CPC ............ *H05G 2/006* (2013.01); *G03F 7/70033* (2013.01); *H05G 2/003* (2013.01); *H05G 2/008* (2013.01)

(58) Field of Classification Search
CPC ....... H05G 2/008; H05G 2/003; H05G 2/006; H05G 2/005; H05G 2/001; G03F 7/20; G03F 7/70858

USPC ............ 250/504 R, 365, 492.2, 493.1, 461.1, 250/492.1; 355/67

See application file for complete search history.

(56) References Cited

U.S. PATENT DOCUMENTS 4,444,734 A    4/1984  Mastrup et al.
7,405,416 B2   7/2008  Algots et al.
(Continued)

FOREIGN PATENT DOCUMENTS

JP    S61-153935 A    7/1986
JP    2000-091095 A   3/2000
(Continued)

OTHER PUBLICATIONS

Non-Final Office Action issued in U.S. Appl. No. 12/646,025 dated Feb. 14, 2013.
(Continued)

*Primary Examiner* — David A Vanore
(74) *Attorney, Agent, or Firm* — Studebaker & Brackett PC

(57) ABSTRACT

A target supply apparatus includes a tank for storing a liquid target material, a nozzle for outputting the liquid target material in the tank, and a gas supply source for supplying gas into the tank, and controls a gas pressure inside the tank with a pressure of the gas supplied from the gas supply source which is provided with a pressure regulator. The target supply apparatus also includes a pressure-decrease gas passage of which one end is connected to the tank and the other end forms an exhaust port, a pressure-decrease valve provided on the pressure-decrease gas passage, and a controller for controlling open/close of the pressure-decrease valve. The controller, when the target material is caused not to output from the nozzle, opens the pressure-decrease valve and decreases the pressure inside the tank.

5 Claims, 18 Drawing Sheets

(51) Int. Cl.
*G21K 5/08* (2006.01)
*G03F 7/20* (2006.01)

(56) References Cited

U.S. PATENT DOCUMENTS

| | | | | |
|---|---|---|---|---|
| 7,417,708 B2 * | 8/2008 | Murakami | ............ | B82Y 10/00 355/53 |
| 7,476,884 B2 | 1/2009 | Gaebel et al. | | |
| 7,615,766 B2 | 11/2009 | Nakano | | |
| 8,003,963 B2 * | 8/2011 | Nagai | ................ | G03F 7/7003 250/423 R |
| 8,154,000 B2 | 4/2012 | Hergenhan et al. | | |
| 8,497,489 B2 * | 7/2013 | Yabu | ................ | G03F 7/70033 250/492.1 |
| 8,581,220 B2 * | 11/2013 | Ishihara | ................ | H05G 2/003 239/102.2 |
| 8,604,451 B2 * | 12/2013 | Yabu | ................ | G03F 7/70033 239/690 |
| 8,610,095 B2 * | 12/2013 | Yabu | ...................... | H05G 2/003 250/365 |
| 8,785,895 B2 * | 7/2014 | Umeda | ............... | G03F 7/70033 250/365 |
| 8,872,126 B2 * | 10/2014 | Umeda | ................ | H05G 2/008 250/288 |
| 9,113,540 B2 * | 8/2015 | Hori | ................... | H01S 3/10061 |
| 9,192,038 B2 * | 11/2015 | Ishihara | ................ | H05G 2/003 |
| 2004/0000637 A1 | 1/2004 | Wieland | | |
| 2010/0213275 A1 * | 8/2010 | Ishihara | ................ | H05G 2/003 239/102.2 |
| 2014/0346375 A1 * | 11/2014 | Nowak | ............... | H01S 3/10015 250/504 R |
| 2016/0029470 A1 * | 1/2016 | Ishihara | ................ | H05G 2/003 250/504 R |
| 2016/0037616 A1 * | 2/2016 | Saito | ..................... | H05G 2/005 250/504 R |

FOREIGN PATENT DOCUMENTS

| | | |
|---|---|---|
| JP | 2005-032510 A | 2/2005 |
| JP | 2006-086110 A | 3/2006 |
| JP | 2007-142306 A | 6/2007 |
| JP | 2007-266234 A | 10/2007 |
| JP | 2008-532228 A | 8/2008 |
| JP | 2008-226462 A | 9/2008 |

OTHER PUBLICATIONS

Notice of Allowance issued in U.S. Appl. No. 12/646,025 dated Jul. 8, 2013.

JP Office Action issued in JP Application No. 2009-288898 dated Feb. 12, 2014.

\* cited by examiner

EUV LIGHT SOURCE APPARATUS

CROSS-REFERENCE TO RELATED APPLICATIONS

This is a continuation application of application Ser. No. 14/047,895, filed on Oct. 7, 2013, which is a Divisional application of application Ser. No. 12/646,025, filed on Dec. 23, 2009, which is an application based upon and claims the benefit of priority from the prior Japanese Patent Applications No. 2008-328274, filed on Dec. 24, 2008 and No. 2009-288898, filed on Dec. 21, 2009; the entire contents of which are incorporated herein by reference.

BACKGROUND OF THE INVENTION

1. Field of the Invention

The present invention relates to a target supply apparatus using for an extreme ultraviolet light source apparatus which generates an extreme ultraviolet (EUV) light from a plasma generated by irradiating a target with a laser light.

2. Description of the Related Art

In recent years, along with a progress in miniaturization of semiconductor device, miniaturization of transcription pattern used in photolithography in a semiconductor process has developed rapidly. In the next generation, microfabrication to the extent of 65 nm to 32 nm, or even to the extent of 30 nm and beyond will be required. Therefore, in order to comply with the demand of microfabrication to the extent of 30 nm and beyond, development of such exposure apparatus combining an extreme ultraviolet (EUV) light source for a wavelength of about 13 nm and a reduced reflective optics is expected.

As the EUV light source, there are three possible types, which are a laser produced plasma (LPP) light source using plasma generated by irradiating a target with a laser beam, a discharge produced plasma (DPP) light source using plasma generated by electrical discharge, and a synchrotron radiation (SR) light source using orbital radiant light. Among these light sources, the LPP light source has such advantages that luminance can be made extremely high as close to the blackbody radiation because plasma density can be made higher compared with the DPP light source and the SR light source. Moreover, the LPP light source also has an advantage that strong luminescence only with a desired wavelength band is possible by selecting a target material. Furthermore, the LPP light source has such advantages that there is no construction such as electrode around a light source because the light source is a point light source with nearly isotropic angular distributions, extremely wide collecting solid angle can be acquired, and so on. Accordingly, the LPP light source having such advantages is expected as a light source for EUV lithography which requires more than several dozen to several hundred watt power.

In the EUV light source apparatus with the LPP system, firstly, a target material supplied inside a vacuum chamber is excited by being irradiated with a laser light and thus be ionized to become plasma (cf. Japanese patent application Laid-Open No. 2007-266234). Then, a cocktail light with various wavelength components including an EUV light is emitted from the generated plasma. Then, the EUV light source apparatus focuses the EUV light by reflecting the EUV light using an EUV collector minor which selectively reflects an EUV light with a desired wavelength, e.g. a 13.5 nm wavelength component. The reflected EUV light is inputted to an exposure apparatus. On a reflective surface of the EUV collector mirror, a multilayer coating with a structure in that thin coating of molybdenum (Mo) and thin coating of silicon (Si) are alternately stacked, for instance, is formed. The multilayer coating has performance of a high reflectance ratio (of about 60% to 70%) with respect to the EUV light with a 13.5 nm wavelength.

In the conventional target supply apparatus, a target is supplied by pressurizing the inside of the tank in the target supply apparatus with gas from a gas cylinder. However, when there is no need to output the EUV light such as during wafer replacement and adjustment of the exposure apparatus or of the EUV light source apparatus, then the supply of the target is not needed. Therefore, the supply of the target when there is no need to output the EUV light becomes waste of the target.

SUMMARY OF THE INVENTION

In accordance with one aspect of the present invention, a target supply apparatus comprises: a tank for storing a liquid target material; a nozzle for outputting the liquid target material in the tank; and a gas supply source for supplying gas into the tank, and the target supply apparatus controlling a gas pressure inside the tank with a pressure of the gas supplied from the gas supply source provided with a pressure regulator, and further comprising: a pressure-decrease gas passage of which one end is connected to the tank and the other end forms an exhaust port; a pressure-decrease valve provided on the pressure-decrease gas passage; and a controller for controlling open/close of the pressure-decrease valve, wherein the controller, when the target material is caused not to output from the nozzle, opens the pressure-decrease valve and decreases the pressure inside the tank.

In accordance with another aspect of the present invention, a control system of a target supply section for controlling a gas pressure inside a tank that stores a liquid target material to be output from a nozzle by the pressure of gas supplied from a gas supply source provided with a pressure regulator, the control system comprising: a pressure-increase system for increasing the pressure inside the tank to a predetermined pressure at which the target material is output from the nozzle; a pressure-decrease system for decreasing the pressure inside the tank; and a controller, when the target material is to be output from the nozzle, for controlling the pressure-increase system to thereby increase the pressure inside the tank to the predetermined pressure and maintaining the pressure, and, when there is not to be output the target material, for controlling the pressure-decrease system and decreasing the pressure inside the tank, to thereby stop the output of the target material or reduce the output of the target material.

In accordance with another aspect of the present invention, a control system of a target supply section for controlling a gas pressure inside a tank that stores a liquid target material to be output from a nozzle by the pressure of gas supplied from a gas supply source provided with a pressure regulator, the control system comprising: a pressure-increase gas passage that connects between the gas supply source and the tank and is provided with the pressure regulator; and a pressure-increase valve provided on the pressure-increase gas passage between the pressure regulator and the tank; a pressure-decrease gas passage that is connected at one end thereof to the pressure-increase gas passage between the tank and the pressure-increase valve and has an exhaust port formed at the other end thereof; a pressure-decrease valve provided on the pressure-decrease gas passage; a first gas passage connected to the pressure-decrease gas passage on the side of the tank from the pressure-decrease valve; a vacuum pump connected to the other end of the first gas passage; a first valve provided on the first gas passage; a pressure gauge for detecting pressure inside the passages among the pressure-increase valve, the pressure-decrease valve, and the tank; and a controller, when the target material is to be output from the nozzle, based on the pressure detected by the pressure gauge, for opening the pressure-increase valve and closing the pressure-decrease valve and the first valve, to thereby increase the pressure inside the tank, and, when output of the target material from the nozzle is to be stopped, for opening the pressure-decrease valve with the first valve closed, to thereby decrease the pressure inside the tank, and then, for closing the pressure-decrease valve and opening the first valve, to thereby further decrease the pressure inside the tank.

In accordance with another aspect of the present invention, a control apparatus of a target supply section provided with a control circuit, the control apparatus comprising: a pressure-increase gas passage connecting between a gas supply source provided with a pressure regulator and the target supply section that outputs a target material in a tank provided with a nozzle from the nozzle by a pressure of gas supplied from the gas supply source; a pressure-increase valve provided on the pressure-increase gas passage between the pressure regulator and the tank; a pressure-decrease gas passage of which one end is connected to the pressure-increase gas passage between the tank and the pressure-increase valve and the other end forms an exhaust port; a pressure-decrease valve provided on the pressure-decrease gas passage; a first gas passage connected to the pressure-decrease gas passage on the side of the tank from the pressure-decrease valve; a vacuum pump connected to the other end of the first gas passage; a first valve provided on the first gas passage; and a pressure gauge for detecting pressure inside the passages among the pressure-increase valve, the pressure-decrease valve, and the tank; and a controller, when the target material is to be output from the nozzle, based on the pressure detected by the pressure gauge, for opening the pressure-increase valve and closing the pressure-decrease valve and the first valve, to thereby increase the pressure inside the tank, and, when output of the target material from the nozzle is to be stopped, for opening the pressure-decrease valve with the first valve closed, to thereby decrease the pressure inside the tank, and then, for closing the pressure-decrease valve and opening the first valve, to thereby further decrease the pressure inside the tank.

In accordance with another aspect of the present invention, a control circuit of a target supply section, the control circuit comprising: a pressure-increase gas passage that connects between a gas supply source provided with a pressure regulator and the target supply section that outputs a target material in a tank provided with a nozzle from the nozzle by a pressure of gas supplied from the gas supply source; a pressure-increase valve provided on the pressure-increase gas passage between the pressure regulator and the tank; a pressure-decrease gas passage of which one end is connected to the pressure-increase gas passage between the tank and the pressure-increase valve and the other end forms an exhaust port; a pressure-decrease valve provided on the pressure-decrease gas passage; a first gas passage connected to the pressure-decrease gas passage on the side of the tank from the pressure-decrease valve; a vacuum pump connected to the other end of the first gas passage; a first valve provided on the first gas passage; and a pressure gauge for detecting pressure inside the passages among the pressure-increase valve, the pressure-decrease valve, and the tank, wherein based on the pressure detected by the pressure gauge, when the target material is to be output from the nozzle, the pressure-increase valve is opened and the pressure-decrease valve and the first valve are closed, to thereby increase the pressure inside the tank, and when output of the target material from the nozzle is to be stopped, the pressure-decrease valve is opened with the first valve closed, to thereby decrease the pressure inside the tank, and then, the pressure-decrease valve is closed and the first valve is opened, to thereby further decrease the pressure inside the tank.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a target supply apparatus, and a control system, a control apparatus, and a control circuit for the same according to the present invention will be explained below with reference to accompanying drawings.

First Embodiment

Figure 1:
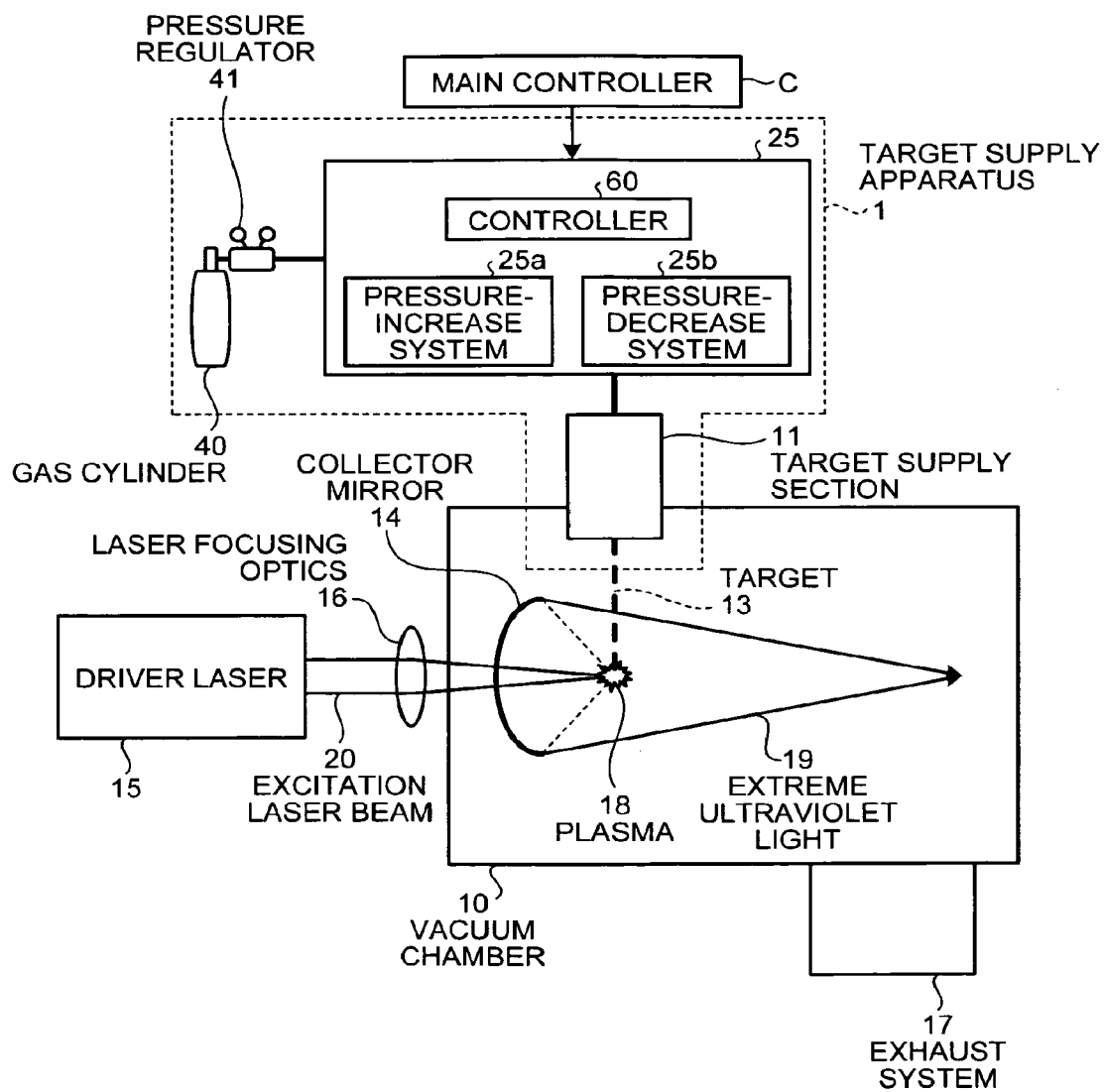
FIG. 1 is a schematic diagram of a configuration of an extreme ultraviolet light source apparatus using a target supply apparatus according to a first embodiment of the present invention.
Figure 2:
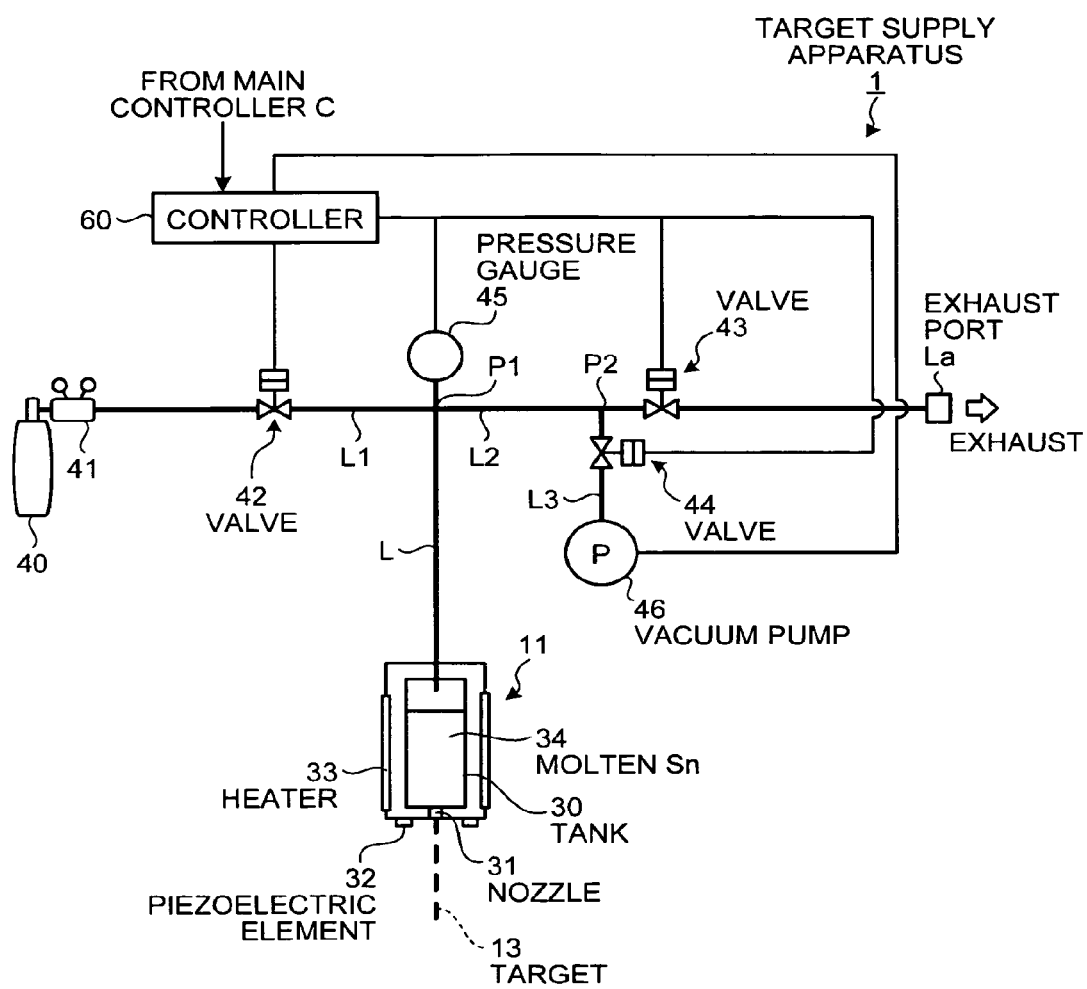
FIG. 2 is a schematic diagram of a detailed configuration of the target supply apparatus shown in FIG. 1.

FIG. 1 is a schematic diagram of a configuration of an extreme ultraviolet light source apparatus using a target supply apparatus according to a first embodiment of the present invention. FIG. 2 is a schematic diagram of a detailed configuration of the target supply apparatus shown in FIG. 1. It should be noted that the extreme ultraviolet light source apparatus shown in FIG. 1 adopts a laser produced plasma (LPP) system for generating an extreme ultraviolet light by irradiating a target material with a laser beam to excite the target material.

As shown in FIG. 1, the extreme ultraviolet light source apparatus includes a vacuum chamber 10 in which an extreme ultraviolet light is generated, a target supply section 11 which supplies a target 13 to a predetermined position in the vacuum chamber 10, a gas cylinder 40 which supplies gas to pressurize the target 13 in order to supply the target 13, a pressure regulator 41 which regulates the pressure of the gas for pressurization, a pressure switch system 25 which switches between pressures of the gas for pressurization, a driver laser 15 which generates an excitation laser beam 20 irradiated to the target 13, a laser focusing optics 16 for focusing the excitation laser beam 20 generated by the driver laser 15, a collector mirror 14 reflecting so as to collect an extreme ultraviolet light 19 emitted from a plasma 18 generated by irradiating the target 13 with the excitation laser beam 20, an exhaust system 17 for keeping vacuum inside the vacuum chamber 10, and a main controller C which controls the whole extreme ultraviolet light source apparatus.

Here, the target supply section 11, the gas cylinder 40, the pressure regulator 41, and the pressure switch system 25 constitute a target supply apparatus 1. Furthermore, the pressure switch system 25 includes a controller 60 which provides at least control for increasing a gas pressure inside the target supply section 11 to a predetermined pressure and maintaining the pressure, a pressure-increase system 25a which increases the gas pressure inside the target supply section 11 and maintains the gas pressure at a predetermined pressure, and a pressure-decrease system 25b which decreases the gas pressure inside the target supply section 11. Moreover, the main controller C provides at least a control instruction such as a pressure-increase instruction and a pressure-decrease instruction to the target supply apparatus 1. The case of providing the pressure-increase instruction is a case where the exposure apparatus (not shown) using an extreme ultraviolet light requires the extreme ultraviolet light, and the case of providing the pressure-decrease instruction is a case where the exposure apparatus does not require the extreme ultraviolet light.

Here, the target supply apparatus 1 that supplies the target into the vacuum chamber is provided with a tank 30 filled with a target material such as a molten liquid of Sn, Li, or the like. The target material (molten Sn 34) inside the tank 30 is molten by a heater 33 provided on the outer wall of the tank 30. The target supply apparatus 1 pressurizes the tank 30 storing the molten target material with the gas from the gas cylinder 40 of which pressure is regulated by the pressure regulator 41. This allows ejection of molten metal (Sn, Li, etc.) as the target 13 from a nozzle 31 attached to a front end of the tank 30. The target 13 is ejected in the form of jet or droplets. The droplets can be generated by a continuous jet method, for example. In the continuous jet method, an vibrator such as a piezoelectric element 32 is used to induce periodic vibrations on the jet surface of the molten metal. This allows the droplets with uniform volume to be ejected from the nozzle.

The target 13 is supplied from the target supply apparatus 1 to the predetermined position in the vacuum chamber 10, and the excitation laser beam 20 outputted from the driver laser 15 is focused to the predetermined position in the vacuum chamber 10 through the laser focusing optics 16. At this time, by irradiating the target 13 with the excitation laser beam 20, the plasma 18 is generated. Thereafter, the extreme ultraviolet light 19 is emitted from the plasma 18. The collector mirror 14 collects the extreme ultraviolet light 19 and outputs the light to the exposure apparatus side (not shown) connected to the vacuum chamber 10. If the excitation laser beam 20 is a pulsed laser beam, an irradiation timing of the target 13 and a pulse generation timing are synchronously controlled by the main controller C.

In the extreme ultraviolet light source apparatus, for example, metal (liquid or solid Sn, Li) is used as the target 13, and carbon dioxide ($CO_2$) laser capable of generating a light with a relatively long wavelength is used as the driver laser 15. One of metals with a high conversion efficiency from laser light energy to extreme ultraviolet light energy is Sn. The conversion efficiency when the carbon dioxide laser is irradiated to the Sn is about 2% to 4%.

The laser focusing optics 16 is composed of at least one lens and/or at least one minor. As shown in FIG. 1, the laser collecting optics 16 may be provided outside the vacuum chamber 10 or may be provided inside the vacuum chamber 10.

The collector mirror 14 is a collecting optics that selectively reflects a predetermined wavelength component (e.g., extreme ultraviolet light of near 13.5 nm) from among various wavelength components emitted from the plasma 18 and collects the component. The collector mirror 14 has a concave reflecting surface. On the reflecting surface, a multilayer coating of molybdenum (Mo) and silicon (Si) which selectively reflect the extreme ultraviolet light with wavelength near 13.5 nm is formed.

As shown in FIG. 2, the target supply section 11 includes the tank 30 that stores the molten Sn 34 inside thereof and has the capability to maintain the internal pressure at, for example, a high pressure or at a predetermined pressure, the heater 33 provided on the outer side of the tank 30 and provided as a heat regulator for melting Sn in the tank 30, the nozzle 31 for ejecting the molten Sn as the target 13, and the piezoelectric element 32 that is provided near the nozzle 31 and causes the target 13 to be continuously ejected as droplets from the nozzle 31.

The pressure regulator 41 autonomously performs pressure regulation so that the gas supplied from the gas cylinder 40 becomes a set predetermined gas pressure. The pressure regulator 41 and the tank 30 are connected to each other by gas passages L1 and L. On the gas passage L1, a valve 42 for opening and closing the passage is provided. Meanwhile, a gas passage L2 is branched from a connection point P1 between the gas passages L1 and L. An exhaust port La is formed at the other end of the gas passage L2. On the gas passage L2, a valve 43 for opening and closing the passage is provided. Furthermore, a gas passage L3 is branched from a connection point P2 between the valve 43 and the connection point P1. A vacuum pump 46 is connected to the other end of the gas passage L3. Moreover, a valve 44 for opening and closing the passage is provided on the gas passage L3 between the vacuum pump 46 and the connection point P2. Near the connection point P1, a pressure gauge 45 for detecting a pressure inside the gas passages is provided. The controller 60 controls the open/close of the valves 42, 43, and 44 and controls the drive of the vacuum pump 46 based on an instruction from the main controller C and a pressure value of the pressure gauge 45.

Figure 3:
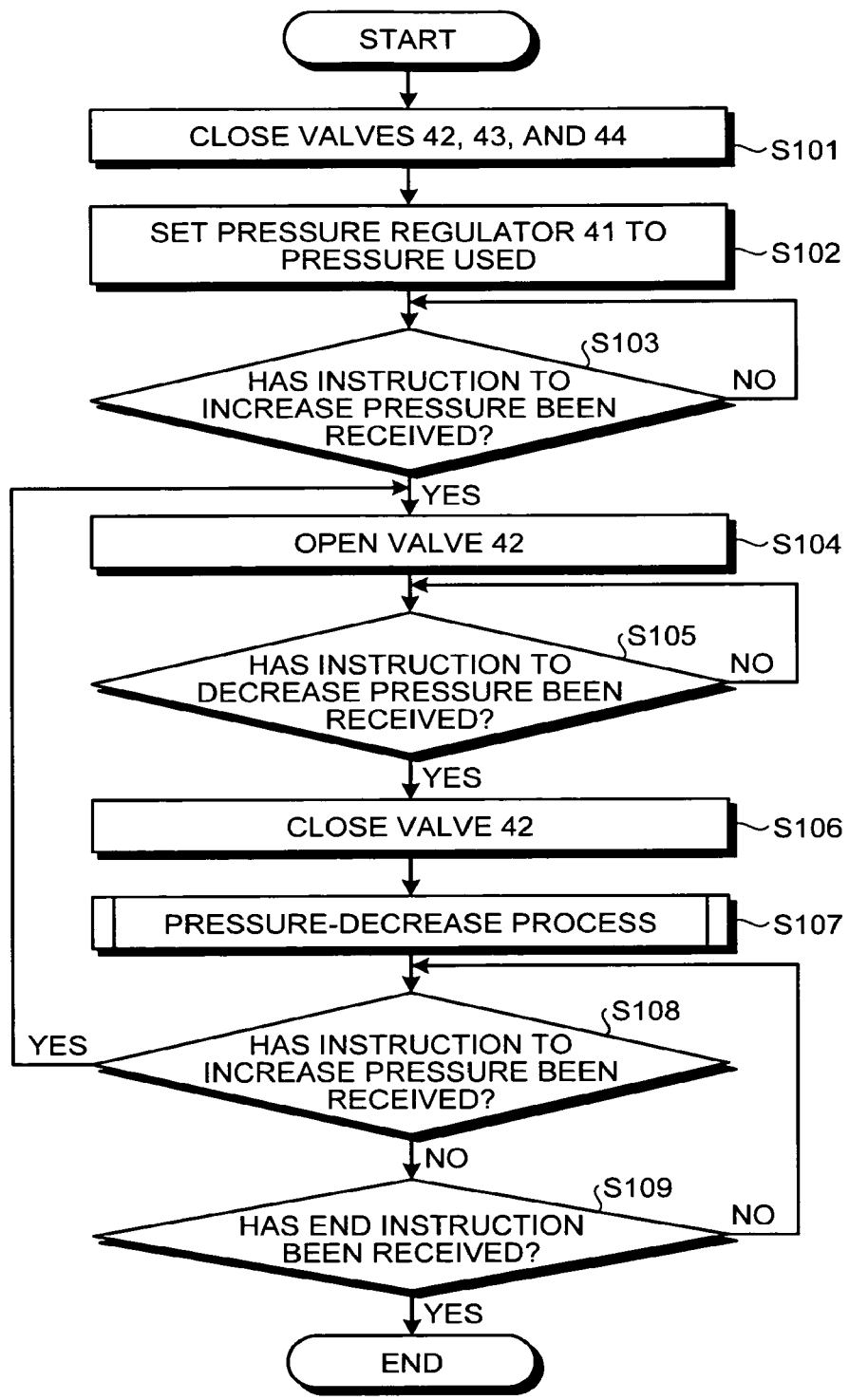
FIG. 3 is an overall flowchart of a pressure switching procedure performed by a controller shown in FIG. 2.

Here, a pressure switching control procedure in the tank 30 performed by the controller 60 is explained with reference to the flowcharts shown in FIG. 3 and FIG. 4. As shown in FIG. 3, first, the controller 60 closes the valves 42, 43, and 44 as an initial setting (Step S101), and then, sets the pressure used upon supply of the target, as a set pressure of the pressure regulator 41 (Step S102). The setting at Step S102 is previously manually performed in the first embodiment. Thereafter, the controller 60 determines whether an instruction to increase the pressure has been received from the main controller C (Step S103). If no instruction to increase the pressure has been received (No at Step S103), the controller 60 repeats the determination process performed at Step S103. Meanwhile, if the instruction to increase the pressure has been received (Yes at Step S103), the controller 60 opens the valve 42 (Step S104), to thereby increase the pressure inside the tank 30 through the gas passages L1 and L. This allows the pressure inside the tank 30 to become a pressure required for supplying the target 13.

Thereafter, the controller 60 determines whether an instruction to decrease the pressure has been received from the main controller C (Step S105). If no instruction to decrease the pressure has been received (No at Step S105), the controller 60 maintains the open state of the valve 42. Thus, the pressure regulation for maintaining a predetermined pressure state inside the tank 30 by the pressure regulator 41 can be executed. Meanwhile, if the instruction to decrease the pressure has been received (Yes at Step S105), the controller 60 closes the valve 42 (Step S106), to thereby ends the pressure-increase process, and then performs the pressure-decrease process (Step S107). After the pressure-decrease process, the controller 60 further determines whether an instruction to increase the pressure has been received (Step S108). If the instruction to increase the pressure has been received (Yes at Step S108), the controller 60 moves to Step S104 and opens the valve 42 which has been closed during the pressure-decrease process to restart the pressure-increase process. Meanwhile, if no instruction to increase the pressure has been received (No at Step S108), the controller 60 further determines whether an end instruction has been received from the main controller C (Step S109). If no end instruction has been received (No at Step S109), the controller 60 moves to Step S108, and waits until an instruction to increase the pressure is received. Meanwhile, if the end instruction has been received (Yes at Step S109), the controller 60 ends the present process.

Figure 4:
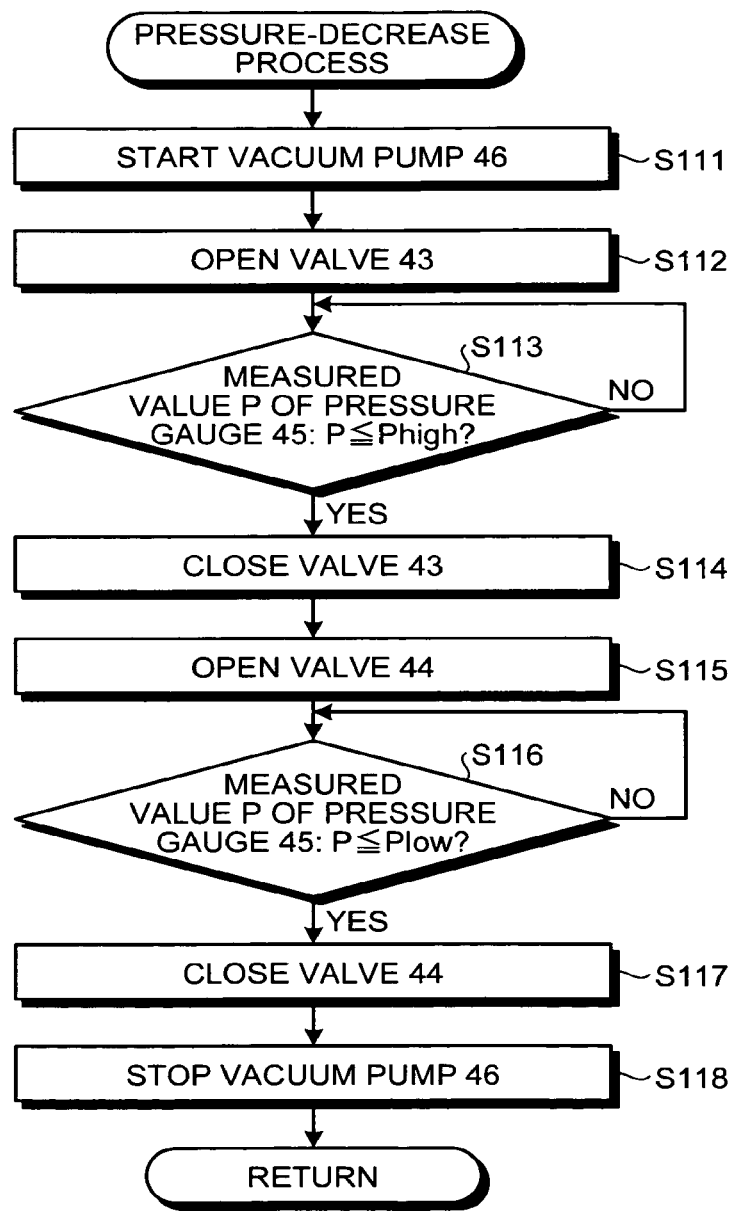
FIG. 4 is a detailed flowchart of a procedure of a pressure-decrease process shown in FIG. 3.

In the pressure-decrease process at Step S107, as shown in FIG. 4, first, the controller 60 starts the vacuum pump 46 (Step S111). It should be noted that the vacuum pump 46 may be set to be on normally. The normally-on of the vacuum pump 46 allows reduction of a pressure-decrease time. Thereafter, the controller 60 opens the valve 43 (Step S112), and thereby exhausts the gas pressurizing inside the tank 30 to the exhaust port La. This causes the pressure inside the tank 30 to decrease. Here, because the inside of the vacuum chamber 10 supplied with the target 13 is vacuum, even if the pressure inside the tank 30 becomes about atmospheric pressure, the supply of the target 13 will not be stopped due to a differential pressure between the pressure inside the vacuum chamber 10 and the pressure inside the tank 30. To stop the supply of the target 13, it is necessary to decrease the pressure inside the pump 30 to a range of tens of Pa to hundreds of Pa. Therefore, the controller 60 determines, as a next process, whether a measured value P of the pressure gauge 45 has become equal to or below a pressure Phigh (e.g., a pressure of 1.1 atmospheres) which is slightly above the atmospheric pressure (Step S113).

If the measured value P of the pressure gauge 45 is not equal to or below the pressure Phigh (No at Step S113), the controller 60 repeats the determination process performed at Step S113. Meanwhile, if the measured value P of the pressure gauge 45 is equal to or below the pressure Phigh (Yes at Step S113), the controller 60 closes the valve 43 (Step S114), and further opens the valve 44 (Step S115). This causes the vacuum pump 46 to exhaust the gas from the tank 30, and the inside of the tank 30 is thereby evacuated.

Thereafter, the controller 60 further determines whether the measured value P of the pressure gauge 45 has become equal to or below the pressure Plow (e.g., a range of tens of Pa to hundreds of Pa) at which the supply of the target 13 is stopped (Step S116). If the measured value P of the pressure gauge 45 is not equal to or below the pressure Plow (No at Step S116), the controller 60 repeats the determination process performed at Step S116. Meanwhile, if the measured value P of the pressure gauge 45 is equal to or below the pressure Plow (Yes at Step S116), then the controller 60 closes the valve 44 (Step S117). It should be noted that the pressure Plow at which the supply of the target is stopped is dependent on the diameter of the nozzle 31, and a remaining amount and a temperature of the target 13. Thereafter, if the vacuum pump 46 is not on normally, the controller 60 stops the vacuum pump 46 (Step S118), and returns to Step S107. It is noted that if the vacuum pump 46 is on normally, the controller 60 does not execute the process at Step S117, and returns to Step S107 as it is.

As explained above, the first embodiment is configured so as to supply and stop the target 13 by disposing the pressure switch system 25 between the pressure regulator 41 and the tank 30 of the target supply section 11 and performing the pressure-increase process and the pressure-decrease process inside the tank 30 using the pressure switch system 25. This configuration allows the supply of the target 13 to be stopped when output of the EUV light is not required in the first embodiment. As a result of this, wasteful consumption of the target is suppressed, which allows achievement of the extreme ultraviolet light source apparatus in which the consumption of the target 13 is suppressed.

Second Embodiment

Figure 5:
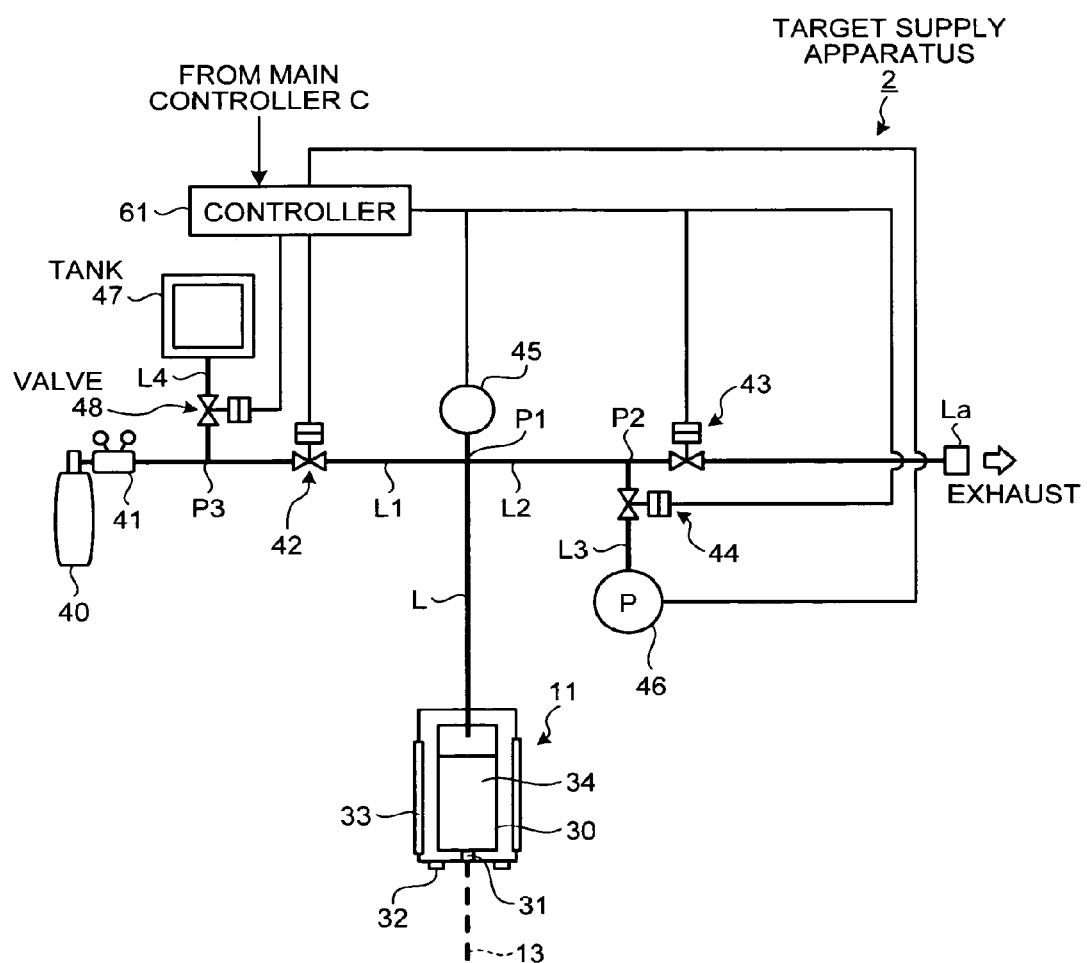
FIG. 5 is a schematic diagram of a detailed configuration of a target supply apparatus according to a second embodiment of the present invention.

Next, a second embodiment of the present invention will be explained below. FIG. 5 is a schematic diagram of a detailed configuration of a target supply apparatus according to the second embodiment of the present invention. As shown in FIG. 5, in a target supply apparatus 2 according to the second embodiment, a gas passage L4 is connected to a connection point P3 between the pressure regulator 41 and the valve 42 of the target supply apparatus 1 according to the first embodiment. A tank 47 is provided at the other end of the gas passage L4. On the gas passage L4, a valve 48 is provided. The capacity of the tank 47 is large as compared with the capacity of the tank 30, which is, for example, about 10 times as large as that of the tank 30. The rest of the configuration is the same as the configuration of the target supply apparatus 1 shown in FIG. 2, and thus, the same numerals are assigned to the same components.

A pressure-increase time required for increasing the pressure inside the tank 30 is determined by a gas flow rate at which gas can be flowed through the pressure regulator 41. Therefore, if the gas flow rate is low, the pressure-increase time becomes longer. Therefore, in the second embodiment, pressure gas previously filled in the tank 47 for increasing the pressure is used to compensate the gas flow rate. This allows reduction of the pressure-increase time requiring for increasing the pressure inside the tank 30.

Figure 6:
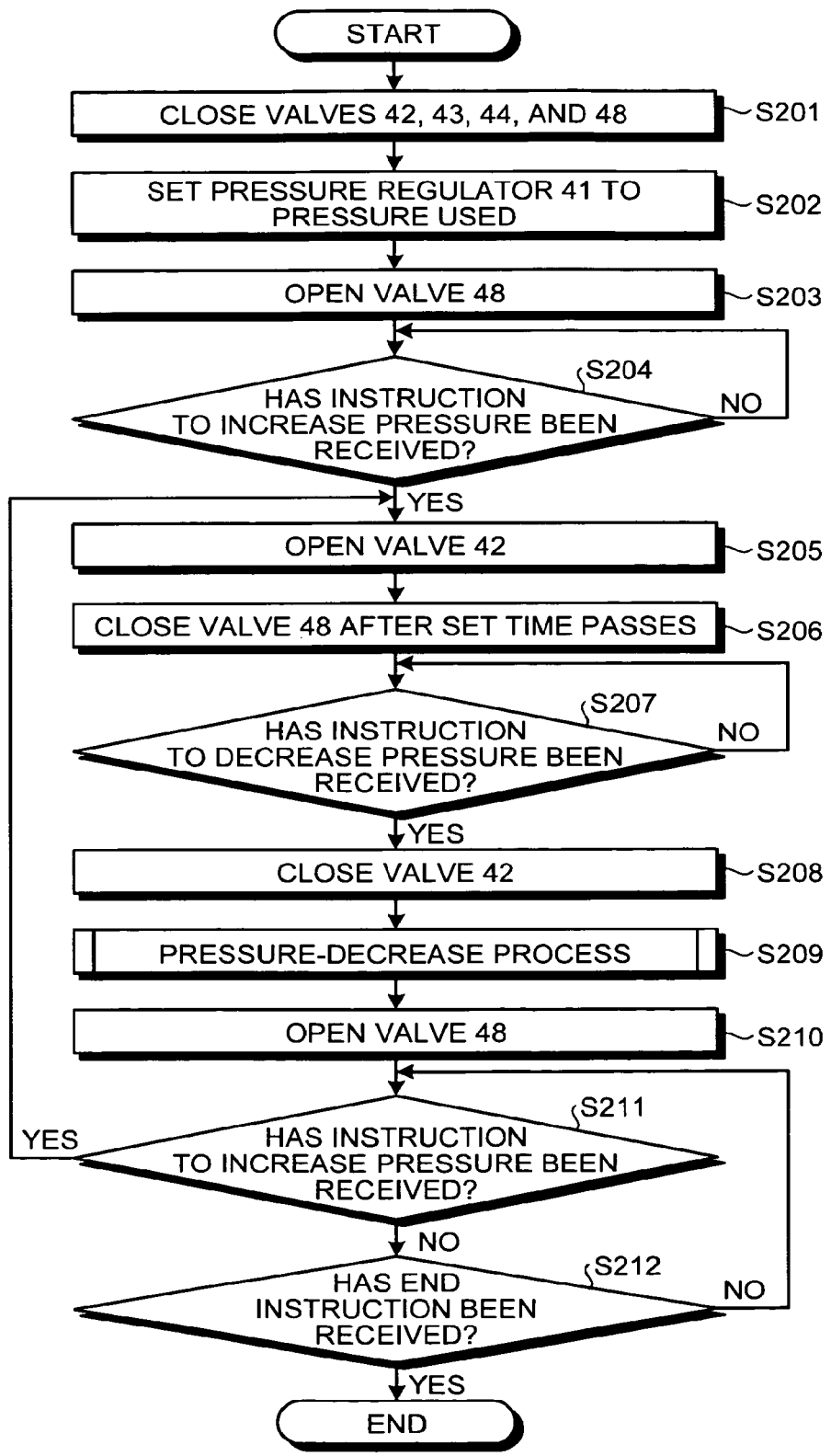
FIG. 6 is an overall flowchart of a pressure switching procedure performed by a controller shown in FIG. 5.

Here, a pressure switching control procedure in the tank 30 performed by a controller 61 corresponding to the controller 60 is explained with reference to the flowchart shown in FIG. 6. As shown in FIG. 6, first, the controller 61 closes the valves 42, 43, 44, and 48 as an initial setting (Step S201), and then, sets the pressure used upon supply of the target, as a set pressure of the pressure regulator 41 (Step S202). Thereafter, the controller 61 opens the valve 48 (Step S203) and determines whether an instruction to increase the pressure has been received from the main controller C (Step S204). If no instruction to increase the pressure has been received (No at Step S204), the controller 61 repeats the determination process performed at Step S204. Meanwhile, if the instruction to increase the pressure has been received (Yes at Step S204), the controller 61 opens the valve 42 (Step S205), to thereby obtain an assist pressure of the tank 47 and increase the pressure inside the tank 30 through the gas passages L4, L1, and L. This causes the pressure inside the tank 30 to be a pressure required for supplying the target 13. Thereafter, the controller 61 closes the valve 48 after a set time passes and further after, for example, several seconds pass (Step S206). This is because there may be a case where the pressure inside the tank 30 does not reach a pressure to be used only by introducing the gas in the tank 47 into the tank 30. Therefore, by supplying the gas from the gas cylinder 40 thereto several seconds longer than the set time through the pressure regulator 41, the gas flow rate supplied to the tank 30 is increased. The reason why the valve 48 is closed at Step S206 is because a piping capacity of the gas passage connected to the tank 30 is reduced. By closing the gas passage not used by the valve, the supply time of gas can be reduced. It is noted that the process at Step S206 may be omitted.

Thereafter, similarly to the first embodiment, the controller 61 determines whether an instruction to decrease the pressure has been received from the main controller C (Step S207). If no instruction to decrease the pressure has been received (No at Step S207), the controller 61 maintains the open state of the valve 42. This causes the pressure regulator 41 that maintains a predetermined pressure state in the tank 30 to perform the pressure regulation. Meanwhile, if the instruction to decrease the pressure has been received (Yes at Step S207), the controller 61 closes the valve 42 (Step S208), to thereby end the pressure-increase process, and then performs a pressure-decrease process (Step S209). The pressure-decrease process is the process shown in FIG. 4. After the pressure-decrease process, the controller 61 further opens the valve 48 (Step S210), to thereby set the pressure inside the tank 47 to a predetermined pressure state.

Thereafter, the controller 61 further determines whether an instruction to increase the pressure has been received (Step S211). If the instruction to increase the pressure has been received (Yes at Step S211), the controller 61 moves to Step S205 and opens the valve 42 which has been closed during the pressure-decrease process, to restart the pressure-increase process using the tank 47. Meanwhile, if no instruction to increase the pressure has been received (No at Step S211), the controller 61 further determines whether an end instruction has been received from the main controller C (Step S212). If no end instruction has been received (No at Step S212), the controller 61 moves to Step S211, and waits until an instruction to increase the pressure is received. Meanwhile, if the end instruction has been received (Yes at Step S212), the controller 61 ends the present process.

As explained above, in the second embodiment, similarly to the first embodiment, it is possible to supply and stop the target material as required. Therefore, if there is no need to output the EUV light, the supply of the target 13 can be stopped. As a result of this, wasteful consumption of the target is suppressed, which allows achievement of the extreme ultraviolet light source apparatus with less consumption of the target 13. Particularly, in the second embodiment, the tank 47 assists in increasing the pressure upon increase of the pressure, and thus, the pressure-increase time can be reduced. Consequently, it is possible to achieve the extreme ultraviolet light source apparatus in which the consumption of the target 13 is further suppressed.

Third Embodiment

Figure 7:
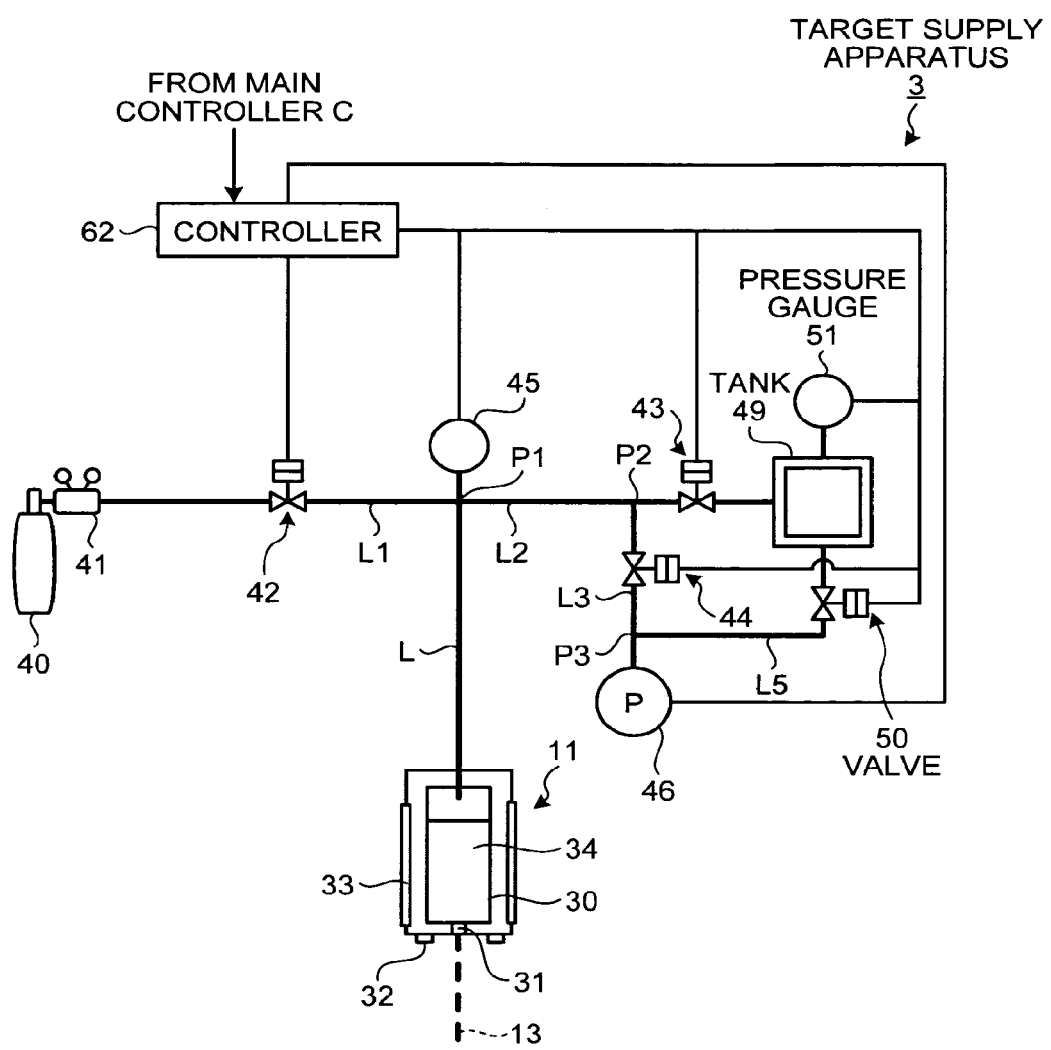
FIG. 7 is a schematic diagram of a detailed configuration of a target supply apparatus according to a third embodiment of the present invention.

Next, a third embodiment of the present invention will be explained below. FIG. 7 is a schematic diagram of a configuration of a target supply apparatus according to the third embodiment of the present invention. As shown in FIG. 7, in a target supply apparatus 3 according to the third embodiment, a tank 49 is provided in place of the exhaust port La of the gas passage L2 shown in the first embodiment. The tank 49 has a large capacity as compared with the capacity of the tank 30, which is, for example, about 100 times as large as that of the tank 30. In the tank 49, a gas passage L5 connected to a connection point P3 on the gas passage L3 between the valve 44 and the vacuum pump 46 is further provided. On the gas passage L5, a valve 50 is provided. A pressure gauge 51 that detects the pressure inside the tank is provided in the tank 49. The rest of the configuration is the same as the configuration of the target supply apparatus 1 shown in FIG. 2, and thus, the same numerals are assigned to the same components.

For example, if an exhaust line from the tank 30 to the exhaust port La is long and a passage resistance is high, a long time is required to decrease the pressure inside the tank 30 to about atmospheric pressure. Therefore, in the third embodiment, by connecting the tank 49 with large capacity in which the pressure is decreased to the pressure below atmospheric pressure to the exhaust line, a pressure gradient of the exhaust line is increased. As a result, an exhaust flow rate of the exhaust line increases, which allows an exhaust time to be reduced.

Figure 8:
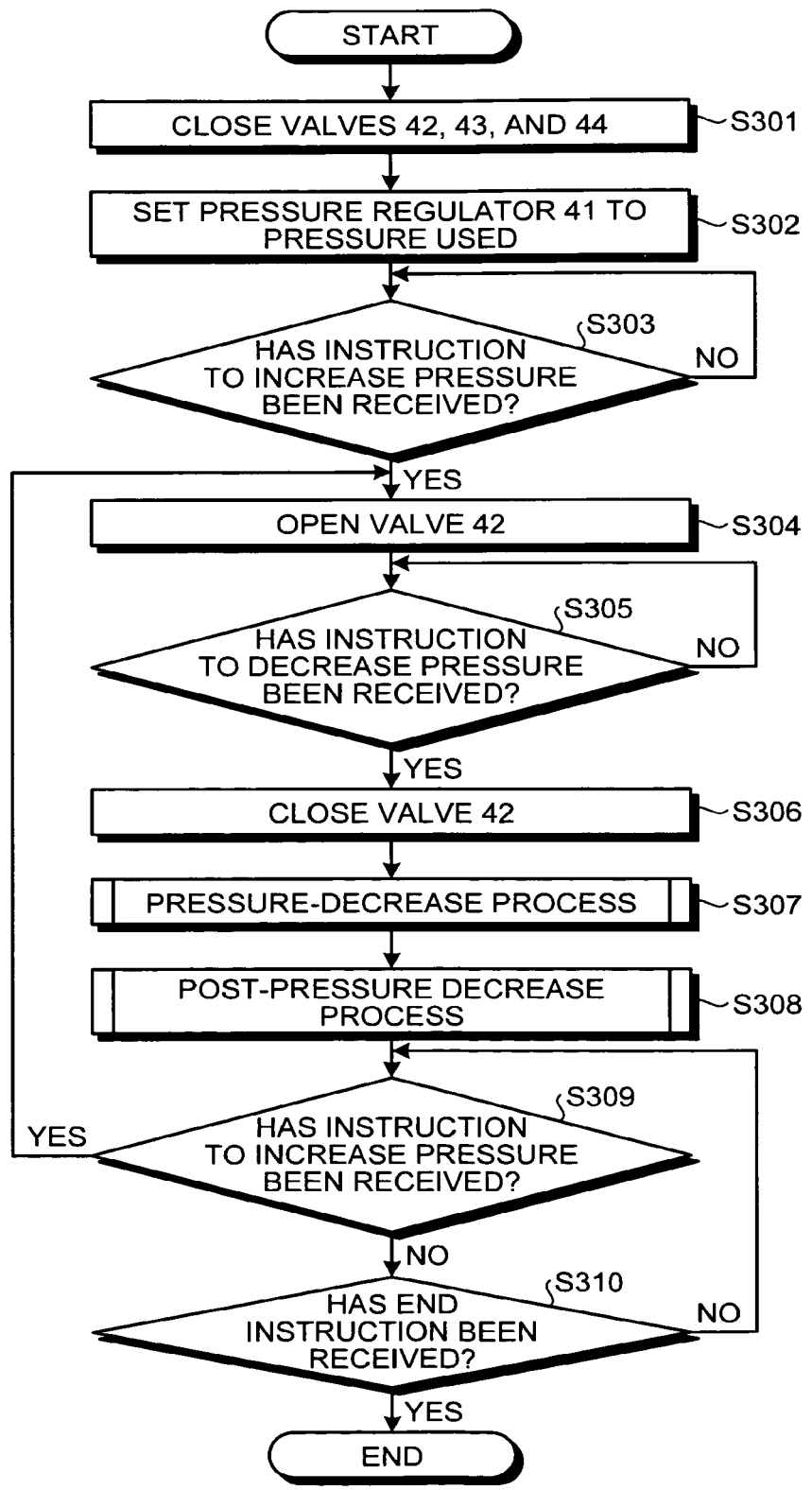
FIG. 8 is an overall flowchart of a pressure switching procedure performed by a controller shown in FIG. 7.

Here, a pressure switching control procedure in the tank 30 performed by a controller 62 corresponding to the controller 60 is explained with reference to the flowcharts shown in FIG. 8 and FIG. 9. FIG. 8 is an overall flowchart of the pressure switching control procedure performed by the controller 62. As is clear from comparison between FIG. 8 and FIG. 3, in the third embodiment, a post-pressure decrease process after the pressure-decrease process is performed (Step S308) is executed between Step S107 and Step S108 shown in FIG. 3. The other processes are the same as these of the first embodiment. It should be noted that Step S301 to Step S307 in FIG. 8 correspond to Step S101 to Step S107 in FIG. 3, and Step S309 and Step S310 in FIG. 8 correspond to Step S108 to Step S109 in FIG. 3.

Figure 9:
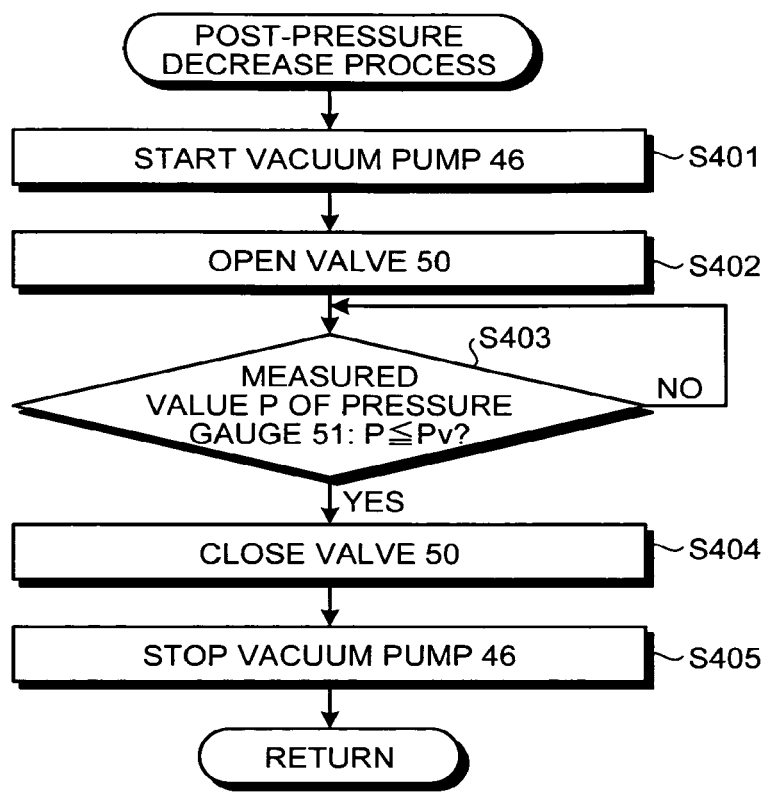
FIG. 9 is a detailed flowchart of a procedure of a post-pressure decrease process shown in FIG. 8.

FIG. 9 is a detailed flowchart of a procedure of a post-pressure decrease process performed at Step S308 in FIG. 8. The post-pressure decrease process is a process, as a preparation process for a next pressure-decrease process, for evacuating the inside the tank 49 to decrease the pressure. In FIG. 9, first, the controller 62 starts the vacuum pump 46 (Step S401). It should be noted that the vacuum pump 46 may be set to be on normally. The normally-on of the vacuum pump 46 allows reduction of a pressure-decrease time. Thereafter, the controller 62 opens the valve 50 (Step S402), and thereby exhausts the gas from the tank 49.

Thereafter, the controller 62 determines whether a measured value P of the pressure gauge 51 is equal to or below a vacuum pressure Pv, for example, equal to or below 1 Pa (Step S403). If the measured value P of the pressure gauge 51 is not equal to or below the vacuum pressure Pv (No at Step S403), the controller 62 repeats the determination process performed at Step S403. Meanwhile, if the measured value P of the pressure gauge 51 is equal to or below the vacuum pressure Pv (Yes at Step S403), the controller 62 closes the valve 50 (Step S404), further stops the vacuum pump 46 (Step S405), and, then, returns to Step S308. When the vacuum pump 46 is on normally, the controller 62 returns to Step S308 as it is after the process at step S404.

As explained above, in the third embodiment, similarly to the first embodiment, it is possible to supply and stop the target material as required. Therefore, when there is no need to output the EUV light, the supply of the target 13 can be stopped. As a result of this, wasteful consumption of the target is suppressed, which allows achievement of the extreme ultraviolet light source apparatus with less consumption of the target 13. Particularly, in the third embodiment, the tank 49 is used to perform the pressure-decrease process, and thus, the pressure gradient of the exhaust line from the tank 30 can be increased. Consequently, it is possible to increase the exhaust flow rate, which allows further reduction of the pressure-decrease time.

Fourth Embodiment

Figure 10:
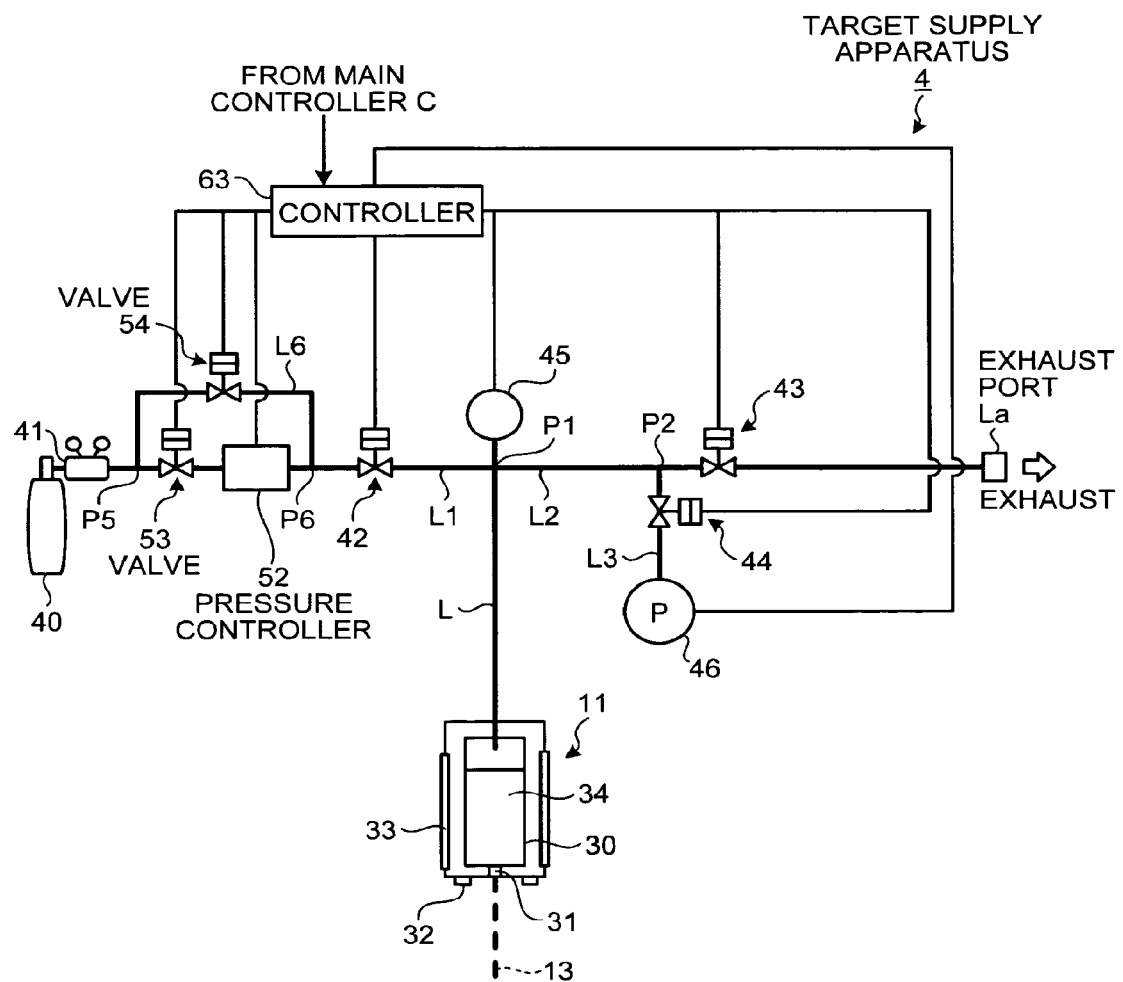
FIG. 10 is a schematic diagram of a detailed configuration of a target supply apparatus according to a fourth embodiment of the present invention.

Next, a fourth embodiment of the present invention will be explained below. FIG. 10 is a schematic diagram of a configuration of a target supply apparatus according to the fourth embodiment of the present invention. As shown in FIG. 10, in a target supply apparatus 4 according to the fourth embodiment, a pressure controller 52 is provided on the gas passage L1 between the pressure regulator 41 and the valve 42 of the target supply apparatus 1 according to the first embodiment, and a gas passage L6 connecting between connection points P5 and P6 on the gas passage L1 on an input side and an output side of the pressure controller 52 is provided to bypass the pressure controller 52. Further, a valve 53 is provided on the gas passage L1 between the connection point P5 and the pressure controller 52, and a valve 54 is provided on the gas passage L6. The rest of the configuration is the same as the configuration of the target supply apparatus 1 shown in FIG. 2, and thus, the same numerals are assigned to the same components.

Here, the pressure to pressurize the molten Sn 34 being the target material in the tank 30 affects the velocity of the target 13. Therefore, it is preferable to keep constant the pressure inside the tank 30. Generally, the pressure is regulated by the pressure regulator 41. It is noted that pressure control with higher precision may be requested dependent on purposes. Therefore, in the fourth embodiment, the pressure controller 52 for performing pressure control with high precision is provided on the gas passage L1. It is noted that a maximum gas flow rate of the high-precision pressure controller 51 is low. Because of this, when the pressure is to be increased through the pressure controller 51, it takes a long time until the pressure reaches a desired pressure. Therefore, in the fourth embodiment, there is provided the gas passage L6 as a bypass line for bypassing the gas passage L1, and when high-precision pressure control is performed by the pressure controller 52, the gas is flowed through the gas passage L6. This allows reduction of the pressure-increase time even if the pressure controller 52 is provided on the gas passage L1.

Figure 11:
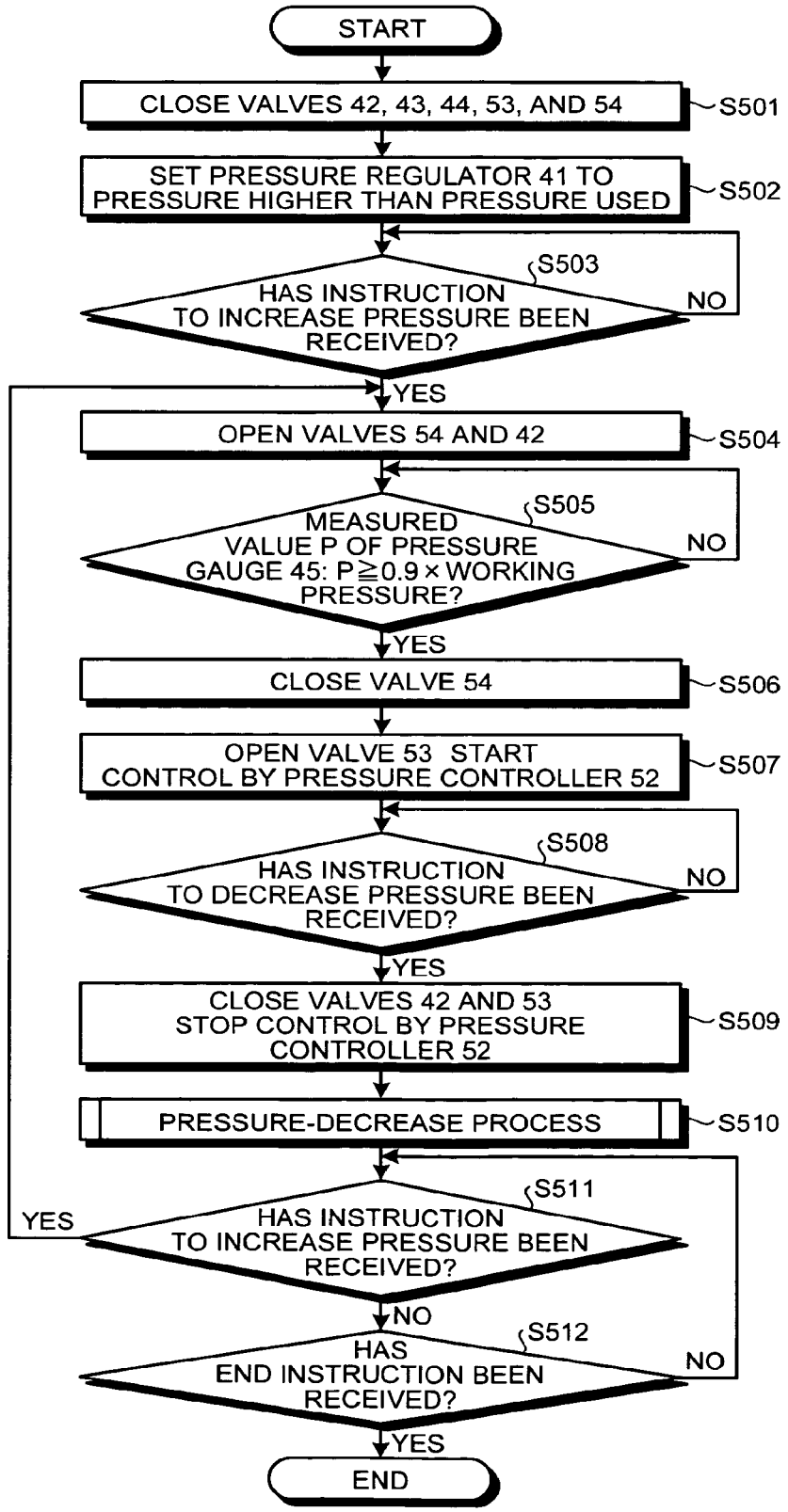
FIG. 11 is an overall flowchart of a pressure switching procedure performed by a controller shown in FIG. 10.

Here, a pressure switching control procedure in the tank 30 performed by a controller 63 corresponding to the controller 60 is explained with reference to the flowchart shown in FIG. 11. As shown in FIG. 11, first, the controller 63 closes the valves 42, 43, 44, 53, and 54, as initial setting (Step S501). Then, the controller 63 sets a pressure higher than the pressure used upon supply of the target, for example, a pressure of 1.1 times as high as the pressure used, as a set pressure of the pressure regulator 41 (Step S502). The set pressure may be preset or may be set by the controller 63. Thereafter, the controller 63 determines whether an instruction to increase the pressure has been received from the main controller C (Step S503). If no instruction to increase the pressure has been received from the main controller C (No at Step S503), the controller 63 repeats the determination process performed at Step S503. Meanwhile, if the instruction to increase the pressure has been received from the main controller C (Yes at Step S503), the controller 63 opens the valves 54 and 42 (Step S504), to thereby increase the pressure inside the tank 30.

Thereafter, the controller 63 determines whether a measured value P of the pressure gauge 45 has become equal to or higher than 90% of a working pressure used upon supply of the target (Step S505). If the measured value P of the pressure gauge 45 is not equal to or higher than 90% of the working pressure (No at Step S505), the controller 63 repeats the determination process performed at Step S505 and continues the pressure-increase process. Meanwhile, if the measured value P of the pressure gauge 45 is equal to or higher than 90% of the working pressure (Yes at Step S505), the controller 63 closes the valve 54 (Step S506), and further opens the valve 53 and uses the pressure controller 52 to increase the pressure inside the tank 30 to the working pressure used for supplying the target (Step S507).

Thereafter, the controller 63 determines whether an instruction to decrease the pressure has been received from the main controller C (Step S508). If no instruction to decrease the pressure has been received from the main controller C (No at Step S508), the controller 63 repeats the determination process performed at Step S508, and thereby causes the pressure controller 52 to perform pressure control with high precision. Meanwhile, if the instruction to decrease the pressure has been received from the main controller C (Yes at Step S508), the controller 63 closes the valves 42 and 53, and thereby stops the pressure control by the pressure controller 52 (Step S509). Thereafter, the controller 63 performs the pressure-decrease process the same as that at Step S107 (Step S510).

After the pressure-decrease process at Step S510, the controller 63 further determines whether an instruction to increase the pressure has been received (Step S511). If the instruction to increase the pressure has been received (Yes at Step S511), the controller 63 moves to Step S504 and restarts the pressure-increase process. Meanwhile, if no instruction to increase the pressure has been received (No at Step S511), the controller 63 further determines whether an end instruction has been received from the main controller C (Step S512). If no end instruction has been received (No at Step S512), the controller 63 moves to Step S511, and waits until an instruction to increase the pressure is received. Meanwhile, if the end instruction has been received (Yes at Step S512), the controller 63 ends the present process.

As described above, in the fourth embodiment, similarly to the first embodiment, it is possible to supply and stop the target material as required. Therefore, if there is no need to output the EUV light, the supply of the target 13 can be stopped. As a result of this, wasteful consumption of the target is suppressed, which allows achievement of the extreme ultraviolet light source apparatus with less consumption of the target 13. Particularly, in the fourth embodiment, there is provided the gas passage L6 as the bypass line for bypassing the gas passage L1, and when high-precision pressure control is performed by the pressure controller 52, the gas is introduced through the gas passage L6. Therefore, the pressure inside the tank 30 can be increased in a short time even if the high-precision pressure controller 52 is provided on the gas passage L1.

Fifth Embodiment

Figure 12:
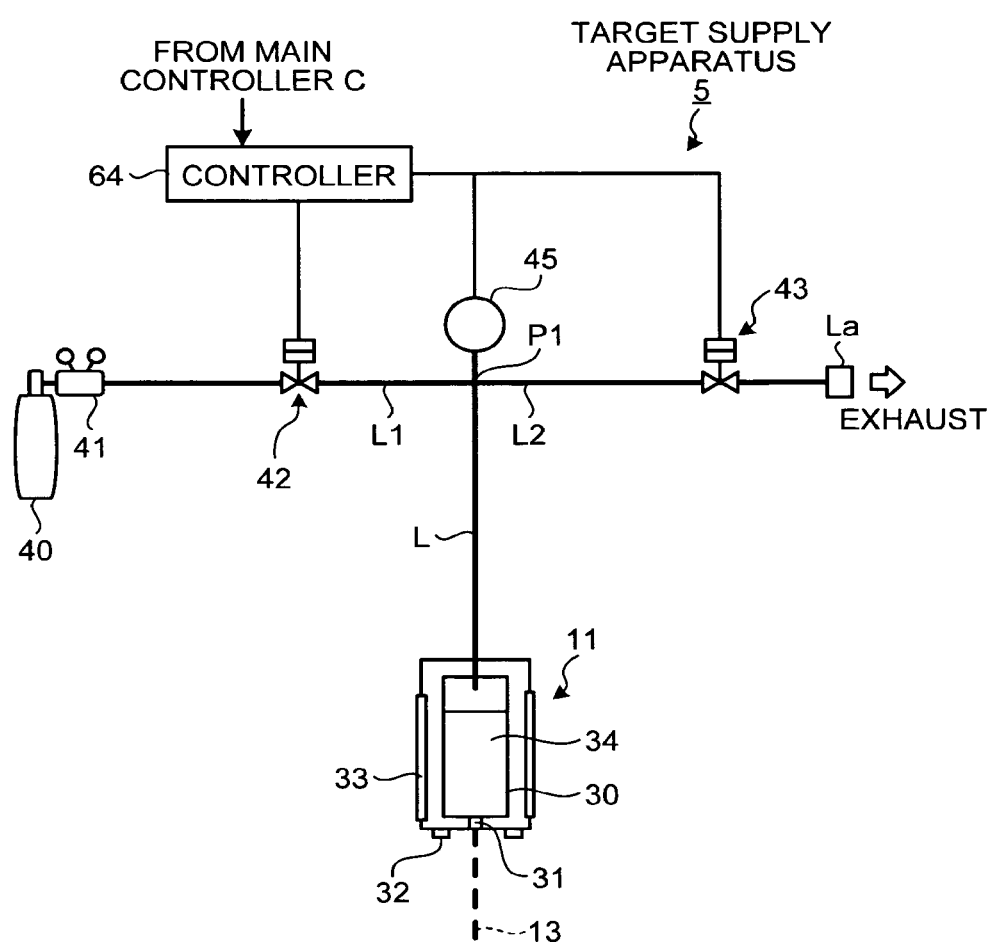
FIG. 12 is a schematic diagram of a detailed configuration of a target supply apparatus according to a fifth embodiment of the present invention.

Next, a fifth embodiment of the present invention will be explained below. FIG. 12 is a schematic diagram of a configuration of a target supply apparatus according to the fifth embodiment of the present invention. As shown in FIG. 12, a target supply apparatus 5 according to the fifth embodiment has the same configuration as that of the target supply apparatus 1 according to the first embodiment. It is noted that, in the target supply apparatus 5 according to the fifth embodiment, the vacuum pump 46, the gas passage L3, and the valve 44 in the target supply apparatus 1 are deleted. The rest of the configuration is the same as the configuration of the target supply apparatus 1 shown in FIG. 2, and thus, the same numerals are assigned to the same components.

Here, in the first embodiment, when the supply of the target 13 is to be stopped, the inside of the tank 30 is evacuated by the vacuum pump to a range of tens of Pa to hundreds of Pa, and thus it takes a long time to stop the supply. Meanwhile, if the evacuation is up to about the atmospheric pressure, the evacuation by the vacuum pump is not needed, and thus, an evacuation time can be reduced. Here, a velocity V upon supply of the target material can be expressed by the following Equation (1).

$$V = \sqrt{2 \times \frac{\Delta P - Ph}{\rho}} \quad (1)$$

In the Equation (1), ΔP is a pressure for pressurizing the target material, Ph is a pressure loss, and ρ is a density of the target material.

It is understood from the Equation (1) that when the pressurization pressure is decreased from several MPa to atmospheric pressure (0.1 MPa), the velocity of the target material becomes about one-tenth. Accordingly, by decreasing the pressure for pressurizing the target material to about atmospheric pressure, the amount of consumption of the target material can be largely reduced. Therefore, in the fifth embodiment, by decreasing the pressure inside the tank 30 to about atmospheric pressure, the amount of consumption of the target 13 can be largely reduced. This allows achievement of the extreme ultraviolet light source apparatus capable of largely suppressing the amount of consumption of the target material when the EUV light is not required. In addition, the configuration of decreasing the pressure inside the tank 30 to about atmospheric pressure can be implemented with a simple configuration, and thus, the configuration of the extreme ultraviolet light source apparatus can be also simplified.

Figure 13:
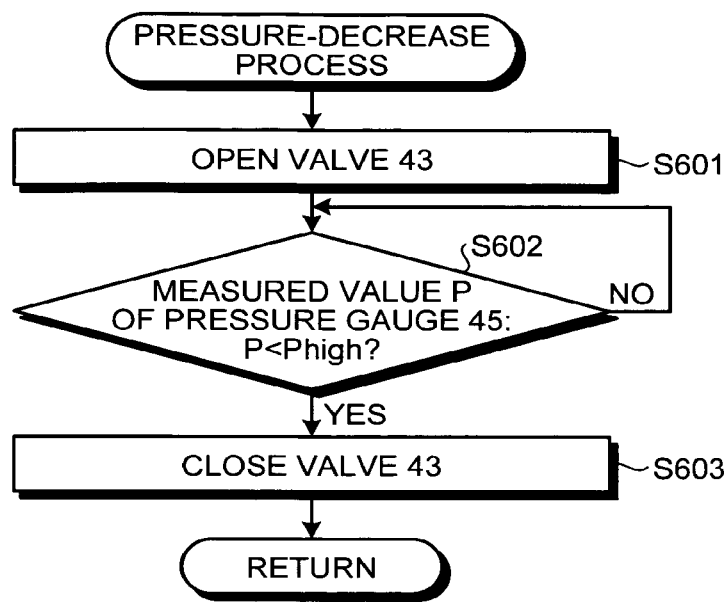
FIG. 13 is a detailed flowchart of a procedure of a pressure-decrease process shown in FIG. 12.

Here, a procedure of a pressure-decrease process performed by a controller 64 corresponding to the controller 60 will be explained below with reference to the flowchart shown in FIG. 13. It should be noted that the pressure-increase process is the same as that of the first embodiment. However, the procedure of the pressure-decrease process is different from that performed at Step S107 shown in FIG. 3. As shown in FIG. 13, first, the controller 64 opens the valve 43 (Step S601), to thereby exhaust the gas pressurizing the inside of the tank 30 to about atmospheric pressure. Thereafter, the controller 64 determines whether a measured value P of the pressure gauge 45 has become equal to or below a pressure Phigh which is slightly above the atmospheric pressure, for example, equal to or below a pressure of 1.1 atmospheres (Step S602). If the measured value P of the pressure gauge 45 is not equal to or below the pressure Phigh (No at Step S602), the controller 64 repeats the determination process performed at Step S602. Meanwhile, if the measured value P of the pressure gauge 45 is equal to or below the pressure Phigh (Yes at Step S602), the controller 64 closes the valve 43 (Step S603), and then returns to Step S107.

As described above, in the fifth embodiment, it is possible to supply the target material and reduce the amount of supply thereof as required. Therefore, it is possible to reduce the amount of supply of the target 13 with a simple configuration. As a result of this, wasteful consumption of the target material can be suppressed without using a complicated configuration such as a vacuum pump, and this allows achievement of the extreme ultraviolet light source apparatus with less consumption of the target 13.

It is possible to achieve a target supply apparatus provided with the pressure switch system 25 in which the pressure-increase system and the pressure-decrease system according to the first to the fifth embodiments are combined as necessary. Moreover, the pressure-decrease system or the like can be modified as required. One examples of modifications will be explained below.

First Modification

Figure 14:
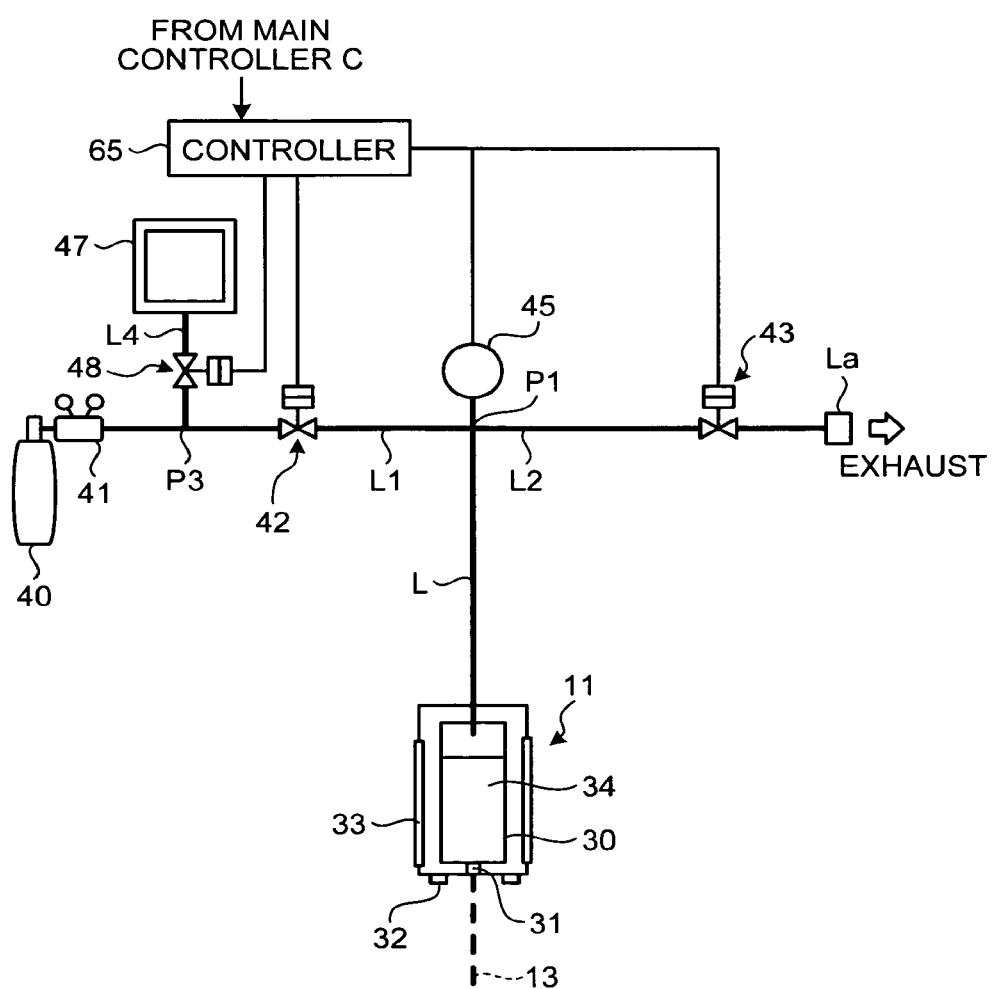
FIG. 14 is a schematic diagram of a detailed configuration of a target supply apparatus according to a first modification of the fifth embodiment of the present invention.

FIG. 14 is a schematic diagram of a configuration of a target supply apparatus according to a first modification in which the configuration of the pressure increase side shown in the second embodiment is applied to the configuration shown in the fifth embodiment. More specifically, the first modification uses the configuration shown in the second embodiment as the pressure-increase system, and uses the configuration shown in the fifth embodiment as the pressure-decrease system. This enables, in the pressure-increase process, the pressure to be increased by the tank 47 in a short time, similarly to the second embodiment. This also enables, in the pressure-decrease process, the consumption of the target material to be suppressed with a simple configuration, similarly to the fifth embodiment.

Second Modification

Figure 15:
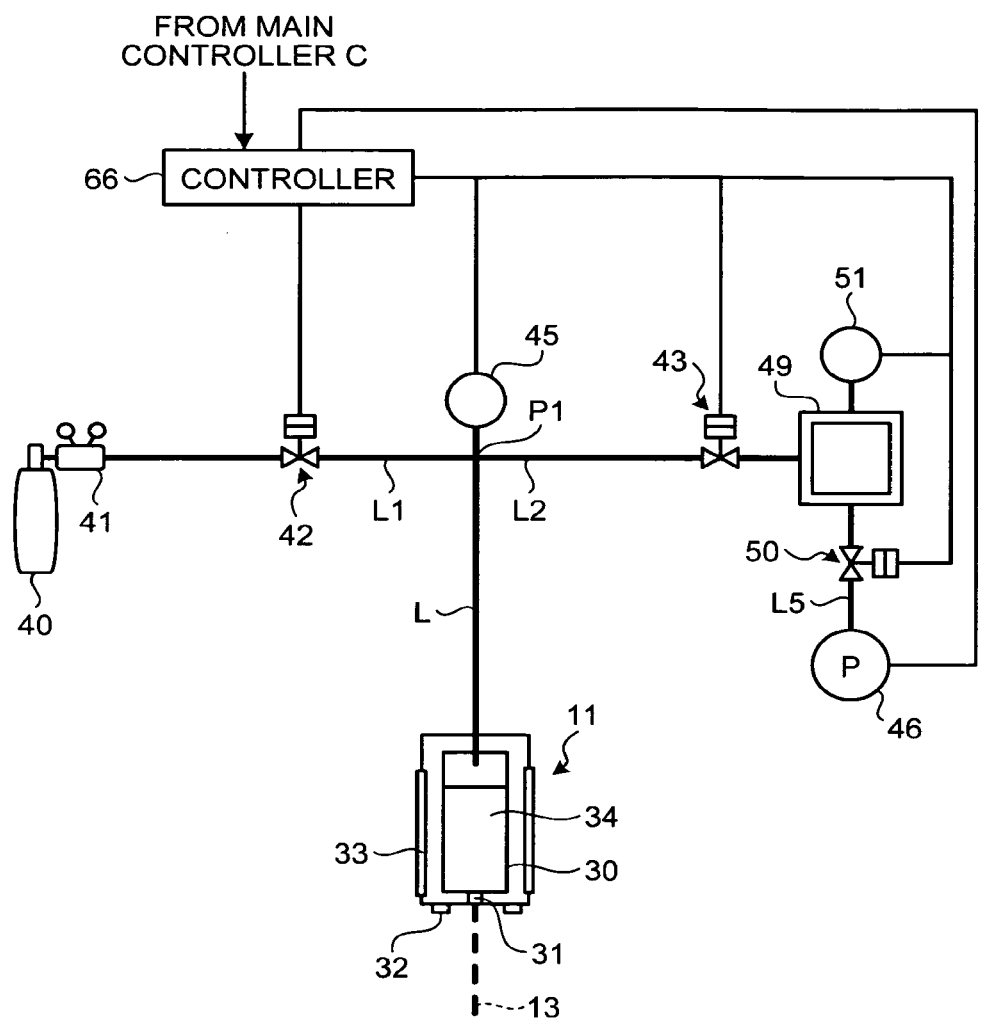
FIG. 15 is a schematic diagram of a detailed configuration of a target supply apparatus according to a second modification of the fifth embodiment of the present invention.

FIG. 15 is a schematic diagram of a configuration of a target supply apparatus according to a second modification in which the configuration of the pressure-decrease system shown in the third embodiment is simplified. As shown in FIG. 15, in the second modification, the gas passage L3 and the valve 44 shown in the third embodiment are deleted, and the connection point P3 of the gas passage L5 is connected to the vacuum pump 46. The rest of the configuration is the same as that of the third embodiment. In the second modification, by previously evacuating the inside the tank 49 by the vacuum pump 46 before the pressure-decrease process, it is possible to perform the pressure-decrease process with a simple configuration and in a short time.

Third Modification

Figure 16:
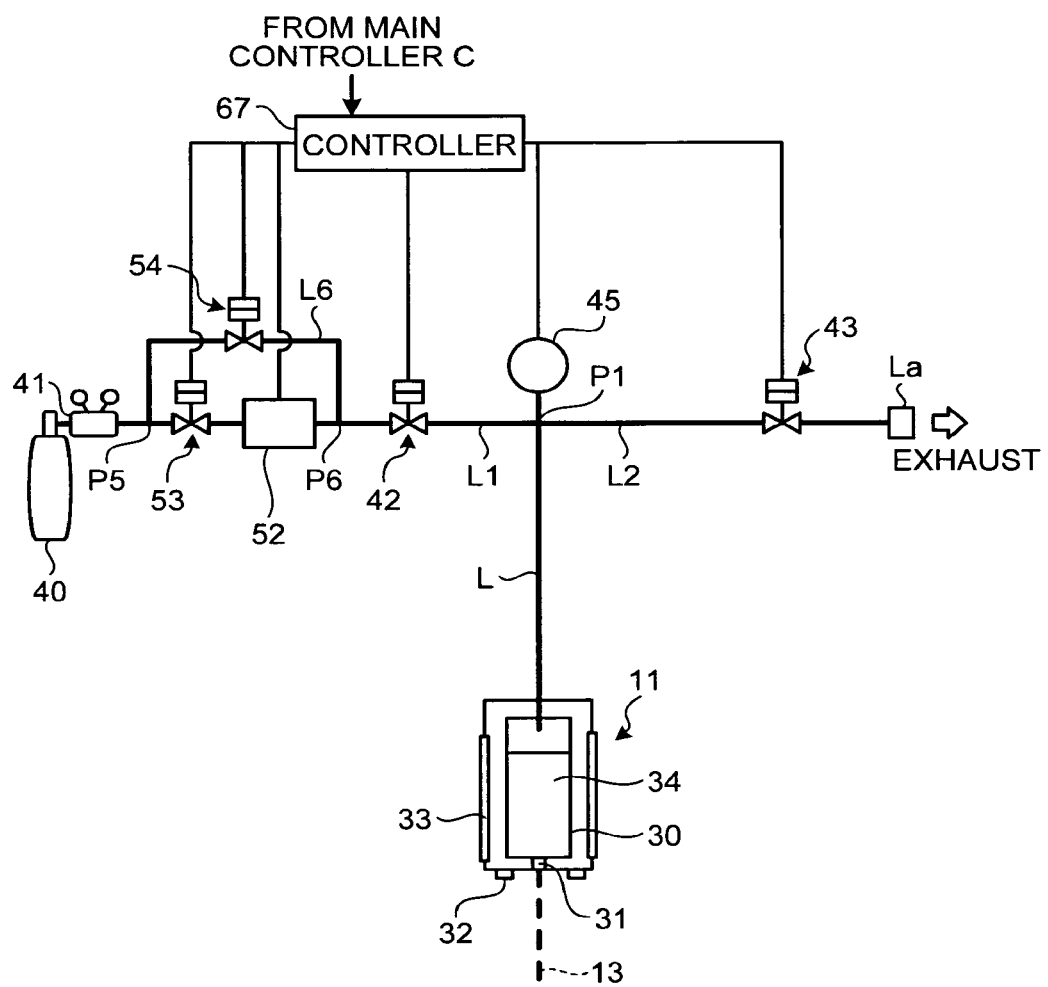
FIG. 16 is a schematic diagram of a detailed configuration of a target supply apparatus according to a third modification of the fifth embodiment of the present invention.

FIG. 16 is a schematic diagram of a configuration of a target supply apparatus according to a third modification in which the configuration of the pressure increase side shown in the fourth embodiment is applied to the configuration shown in the fifth embodiment. More specifically, the third modification uses the configuration shown in the fourth embodiment as the pressure-increase system, and uses the configuration shown in the fifth embodiment as the pressure-decrease system. This enables, in the pressure-increase process, the pressure to be increased in a short time and high-precision pressure control to be performed, similarly to the fourth embodiment. This also enables wasteful consumption of the target material to be suppressed with a simple configuration, similarly to the fifth embodiment.

In the first to the fifth embodiments and the first to the third modifications, the gas passage directly connected to the tank 30 is the common gas passage L. However, it is not limited to the configuration. For example, the gas passage L1 on the pressure increase side and the gas passage L2 on the pressure decrease side may be separately connected to the tank 30.

Sixth Embodiment

Next, a sixth embodiment of the present invention will be explained below. The first to the fifth embodiments and the modifications adopt the continuous jet method as a target supply method. Therefore, in the first to the fifth embodiments and the modifications, the pressure inside the tank 30 is maintained at a comparatively high pressure of about several MPa to a dozen MPa or so. On the other hand, the sixth embodiment adopts an electrostatic attraction method. In the electrostatic attraction method, an electrode is disposed in a position opposite to a nozzle tip. For example, when the nozzle tip is grounded and a voltage is applied to the electrode, then an electrostatic attractive force is exerted on the target material. The electrostatic attractive force and the gas pressure inside the tank cause the target material to be ejected from the nozzle tip in the form of droplets. As explained above, in the target supply apparatus adopting the electrostatic attraction method, by applying the voltage to the electrode, the electrostatic attractive force works. Therefore, the pressure inside the tank that stores the target material may be a comparatively low pressure, for example, a pressure equal to or less than 1 MPa, as compared with the case in which the continuous jet method is adopted.

Here, one example of the target supply apparatus according to the sixth embodiment will be explained. In the following explanation, there is exemplified a case where the electrostatic attraction method is adopted to the target supply apparatus 1 according to the first embodiment. However, it is not limited thereto, and thus, the sixth embodiment can be applied to any one of the second to the fifth embodiments and the modifications thereof.

Figure 17:
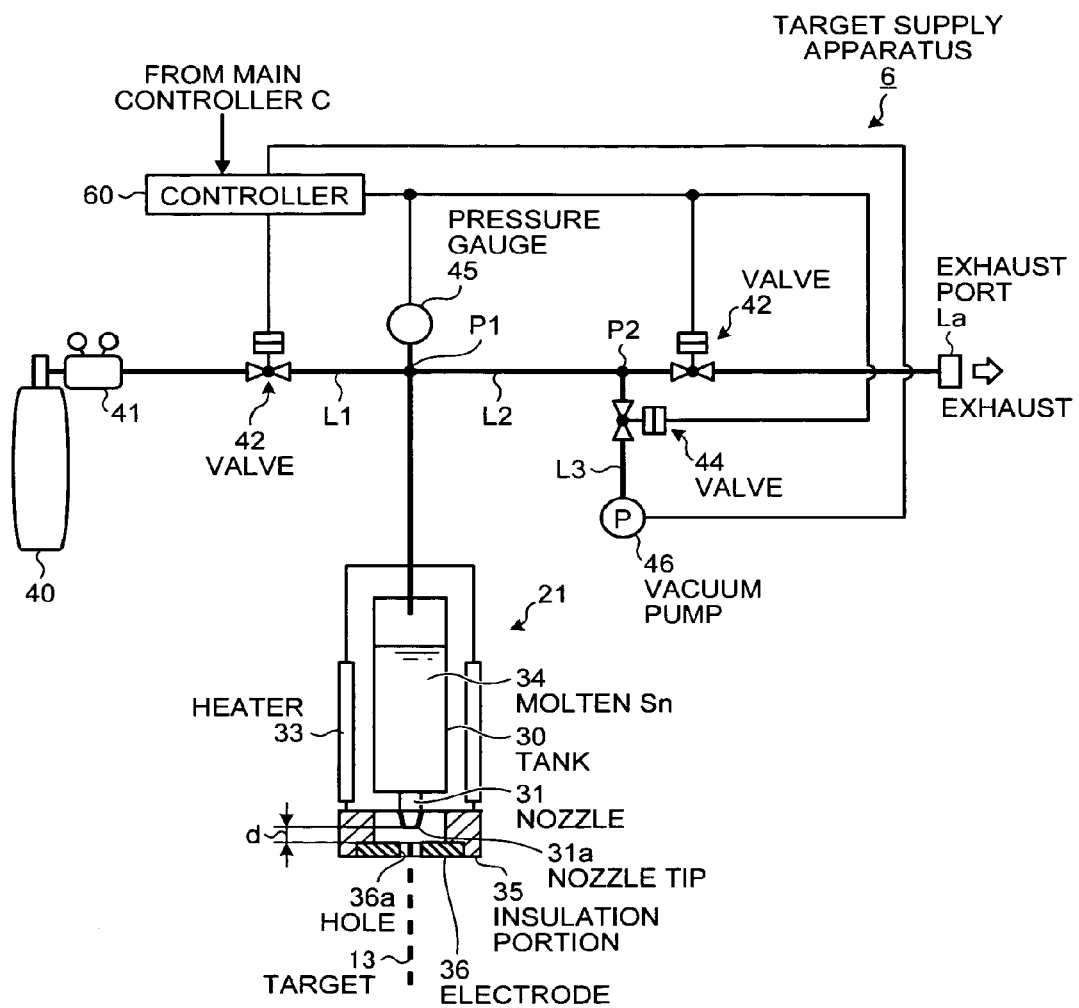
FIG. 17 is a schematic diagram of a detailed configuration of a target supply apparatus according to a sixth embodiment of the present invention.

FIG. 17 is a schematic diagram of a configuration of the target supply apparatus according to the sixth embodiment. As shown in FIG. 17, in a target supply apparatus 6 according to the sixth embodiment, the target supply section 11 is replaced with a target supply section 21 based on the same configuration as that of the target supply apparatus 1 shown in FIG. 2. The target supply section 21 includes, in addition to the same configuration as that of the target supply section 11, an electrode 36 disposed opposite to a nozzle tip 31a, and an insulation portion 35 for insulating between the electrode 36 and a nozzle tip 31a and fixing a space therebetween to be separated by a certain distance d. At a portion of the electrode 36 corresponding to the nozzle 31 or along a path of ejection of the target 13, a hole 36a for passing the target 13 therethrough is formed.

To the electrode 36, a voltage signal to generate an electric field that attracts the target material from the nozzle 31 is inputted. The voltage signal may be a pulse signal such as a square wave, a triangle wave, or a sine (cosine) wave, or may be a constant voltage signal. Moreover, the nozzle tip 31a may be grounded or may be applied with a potential having a polarity opposite to the polarity of the voltage signal. By applying a high-precision voltage signal, the force (electrostatic attractive force) of attracting the target material being molten metal from the nozzle 31 can be kept constant. Furthermore, the nozzle tip 31a being a tip portion of the nozzle 31 conically projects toward the direction of ejection of the target 13. This allows the electric field formed between the electrode 36 and the nozzle 31 to be focused on near the nozzle tip 31a. As a result, it is possible to efficiently attract the target material from the nozzle 31 and eject it as the target 13.

As explained above, even in the target supply apparatus 6 using the so-called electrostatic attraction method for using the electrostatic attractive force to actively eject the target 13 from the nozzle 31 in a drop-on-demand manner, it is preferable to keep the pressure inside the tank 30 to be a constant pressure (<1 MPa), similarly to the first to the fifth embodiments and the modifications thereof.

It should be noted that the pressure for pressurizing the inside of the tank may be about a critical value at which the target material (molten Sn) is output from the nozzle tip 31a. A critical value P can be expressed by the following Equation (3).

$$P = \frac{2\gamma}{r} - \rho \times gh \qquad (2)$$

In the Equation (3), $\gamma$ is a surface tension of the target material, r is a radius of the hole of the nozzle tip 31a, $\rho$ is a density of the target material, g is an acceleration of gravity, and h is a height from the nozzle tip 31a to an upper surface of liquid level of the target material.

Here, if the surface tension of the target material be $\gamma=0.573$ [N/m], the radius of the hole of the nozzle tip 31a be r=5 [N/m], the density of the target material be $\rho=7000$ [kg/m$^3$], the acceleration of gravity be g=9.8 [N/s], and the height from the nozzle tip 31a to the upper surface of liquid level of the target material be h=0.2 [m], then a critical value of the gas pressure becomes P=215 [kPa].

Moreover, it is understood that an allowable fluctuation range of the pressure inside the tank 30 (for example, a value to such an extent that a fluctuation can be regarded as an error) in the case of using the electrostatic attraction method is about ±10 Pa if the value be equal to or less than 5% of the fluctuation. In this manner, by suppressing a fluctuation range of the pressure inside the tank 30 to within a small fluctuation range of, for example, ±10 Pa or less, a velocity fluctuation of the target 13 is reduced, so that a fluctuation of the position on which the EUV light is collected can be suppressed. As a result, it is possible to achieve the extreme ultraviolet light source apparatus capable of reducing unevenness of exposure occurring in an exposure device. The sixth embodiment also provides the heater 33 for controlling the temperature of the molten Sn 34 to be constant, and this causes the velocity fluctuation of the target 13 to be less, so that the fluctuation of the position on which the EUV light is collected can be further suppressed. Consequently, it is possible to achieve the extreme ultraviolet light source apparatus capable of further reducing the unevenness of exposure occurring in an exposure device.

Figure 18:
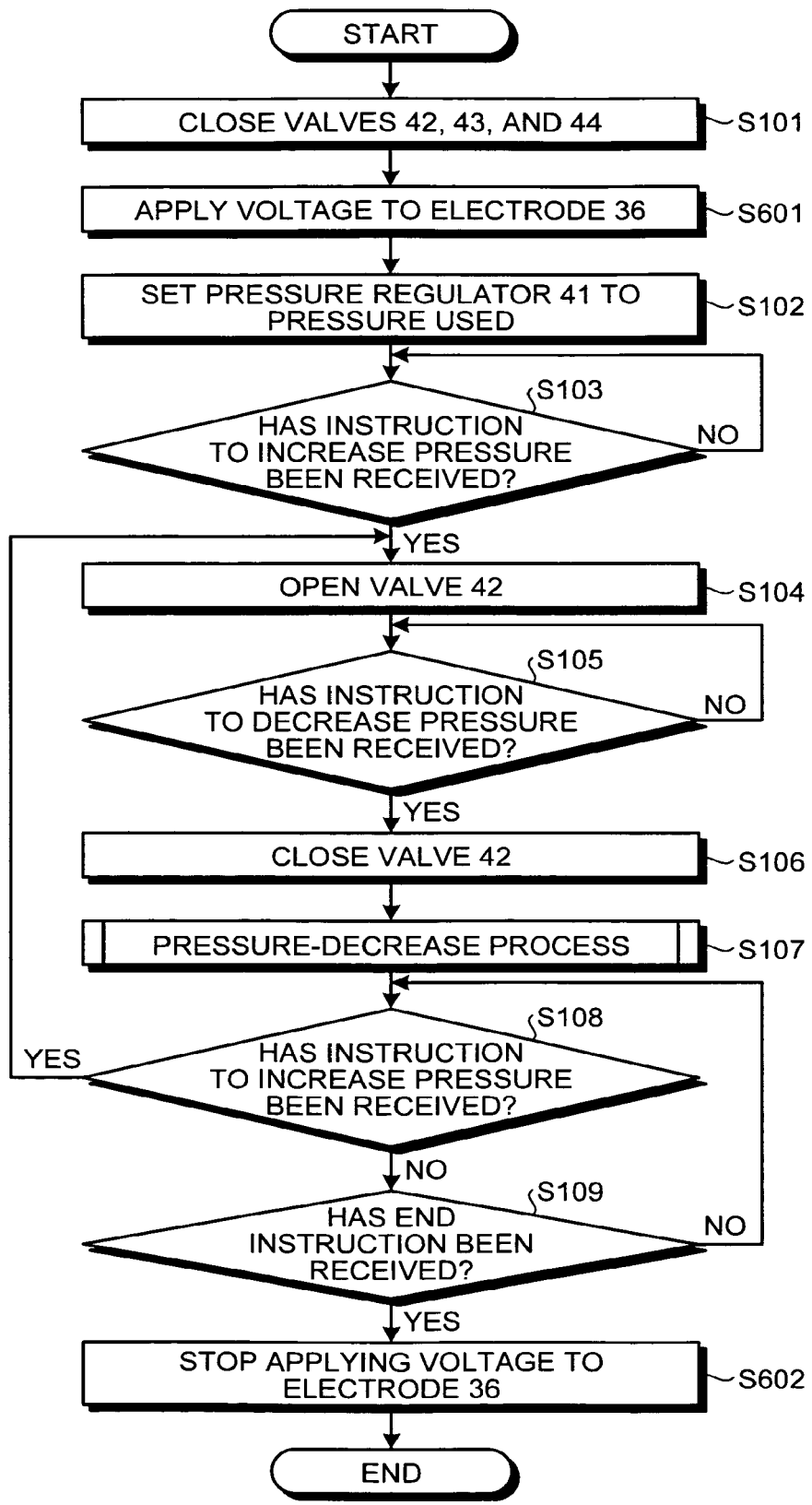
FIG. 18 is an overall flowchart of a pressure switching procedure performed by a controller shown in FIG. 17.

Next, a pressure switching control procedure in the tank 30 performed by a controller 68 corresponding to the controller 60 is explained with reference to the flowchart shown in FIG. 18. FIG. 18 is an overall flowchart of a pressure switching control procedure performed by the controller 68. As is clear from comparison between FIG. 18 and FIG. 3, in the sixth embodiment, a process (Step S601) for applying a voltage for ejection of the target to the electrode 36 is executed between Step S101 and Step S102 shown in FIG. 3, and a process (Step S602) for stopping application of the voltage to the electrode 36 is executed after Step S109 shown in FIG. 3. The rest of the steps are the same as these of FIG. 3, and thus, detailed explanation thereof is omitted. It is noted that as a result of Step S104, the gas pressure inside the tank 30 is controlled to a pressure which is about the critical value due to the Equation (2) and at which the target 13 is output from the nozzle 31 with the voltage applied to the electrode 36. Furthermore, the pressure-decrease process at Step S107 is the same as that explained with reference to FIG. 4.

Based on the configuration and the operations, even in the target supply apparatus adopting the electrostatic attraction method as shown in the sixth embodiment, the same effects as these in the embodiments and the modifications can be obtained.

As explained above, according to the embodiments of the present invention, if there is no need to eject a molten target material, it is possible to decrease the pressure inside the tank by using the valve for pressure decrease provided on the gas passage for pressure decrease. Therefore, it is possible to achieve the target supply apparatus, the control system, the control apparatus, and the control circuit capable of reducing waste of the target.

It should be noted that the embodiments and the modifications are only examples of implementing the present invention, and thus, the present invention is not limited thereto. Therefore, it is apparent from the description that various modifications according to specifications or the like fall within the scope of the present invention, and furthermore, that other various embodiments are possible within the scope of the present invention. Moreover, the embodiments and the modifications can be mutually combined as required.

the invention claimed is:

1. An extreme ultraviolet light source apparatus comprising:
   a target supply apparatus including:
      a tank for storing a liquid target material;
      a nozzle for outputting the liquid target material in the tank; and
      a gas supply source for supplying gas into the tank, and the target supply apparatus controlling a gas pressure inside the tank with a pressure of the gas supplied from the gas supply source provided with a pressure regulator;
   a chamber in which an extreme ultraviolet light is generated, by irradiating the liquid target material outputted from the nozzle with a laser beam;
   a collector mirror provided in the chamber and configured to collect the generated extreme ultraviolet light;
   a first gas passage connected to the tank, the gas from the tank being exhausted through the first gas passage;
   a first valve provided on the first gas passage;
   a second gas passage connected to the first gas passage between the tank and the first valve;
   a second valve provided on the second gas passage; and
   a controller configured to control open/close of the first valve and the second value, wherein the controller closes the first valve and opens the second valve such that the gas from the tank flowing through the first gas passage is exhausted through the second gas passage.

2. The extreme ultraviolet light source apparatus according to claim 1, further comprising a gas supply passage provided separately from the first gas passage and the second gas passage, and configured to connect between the gas supply source and the tank.

3. The extreme ultraviolet light source apparatus according to claim 1, wherein, in order to decrease a gas pressure inside the tank when the liquid target material is outputted from the nozzle, the controller controls the open/close of the first valve and the second valve such that:
   the controller opens the first valve and closes the second valve to exhaust the gas from the tank through the first gas passage, until the gas pressure inside the first gas passage reaches a predetermined gas pressure; and
   the controller closes the first valve and opens the second valve to exhaust the gas from the tank through the second gas passage, after the gas pressure inside the first gas passage reaches the predetermined gas pressure.

4. The extreme ultraviolet light source apparatus according to claim 3, wherein:
   a range of the gas pressure inside the first gas passage from when the liquid target material is outputted from the nozzle until the gas pressure reaches the predetermined gas pressure is a first range;
   a range of the gas pressure inside the first gas passage from when the gas pressure reaches the predetermined gas pressure until the output of the liquid target material from the nozzle is stopped is a second range; and
   the gas pressure inside the first gas passage within the first range is higher than the predetermined gas pressure, and the gas pressure inside the first gas passage within the second range is lower than the predetermined gas pressure.

5. The extreme ultraviolet light source apparatus according to claim 4, wherein the first range is greater than the second range.

* * * * *